United States Patent [19]

Bessios

[11] Patent Number: 6,018,304
[45] Date of Patent: Jan. 25, 2000

[54] METHOD AND APPARATUS FOR HIGH-RATE N/N+1 LOW-COMPLEXITY MODULATION CODES WITH ADJUSTABLE CODEWORD LENGTH AND ERROR CONTROL CAPABILITY

[75] Inventor: Anthony Bessios, Dallas, Tex.

[73] Assignee: Texas Instruments Incorporated, Dallas, Tex.

[21] Appl. No.: 09/046,347

[22] Filed: Mar. 23, 1998

Related U.S. Application Data

[60] Provisional application No. 60/068,016, Dec. 18, 1997.

[51] Int. Cl.[7] ................................................. H03M 5/00
[52] U.S. Cl. ............................... 341/58; 714/811; 341/59
[58] Field of Search ................................ 341/58, 59, 100, 341/73; 714/761, 800, 799, 754, 812, 802, 811; 708/628

[56] References Cited

U.S. PATENT DOCUMENTS

| | | | |
|---|---|---|---|
| 4,707,681 | 11/1987 | Eggenberger et al. | 341/59 |
| 5,196,849 | 3/1993 | Galbraith | 341/59 |
| 5,260,703 | 11/1993 | Nguyen et al. | 341/100 |
| 5,280,439 | 1/1994 | Quek et al. | 708/628 |
| 5,465,262 | 11/1995 | Dell et al. | 714/802 |
| 5,557,622 | 9/1996 | Hassoun et al. | 714/800 |
| 5,576,707 | 11/1996 | Zook | 341/58 |
| 5,635,933 | 6/1997 | Fitzpatrick et al. | 341/58 |
| 5,682,155 | 10/1997 | McLaughlin | 341/59 |
| 5,691,993 | 11/1997 | Fredrickson | 714/761 |
| 5,859,600 | 1/1999 | Nozawa | 341/58 X |

OTHER PUBLICATIONS

"An 8/9 Rate Time–Varying Trellis Code for High Density Magnetic Recording", William G. Bliss, IEEE Transactions on Magnetics, vol. 33, No. 5, Sep. 1997, pp. 2746–2748.

"Combined ECC/RLL Codes*", Lin, et al., IEEE Transacations on Magnetics, vol. 24, No. 6, Nov. 1988, pp. 2527–2529.

Allen, et al., "10.6 Medium–Speed A/D Converters", CMOS Analog Circuit Design, 1987, pp. 560–570.

Design of a Rate 6/7 Maximum Transition Run Code, Brickner, et al., IEEE Transactions on Magnetics, vol. 33, No. 5, Sep., pp. 2749–2751.

IBM Technical Disclosure Bulletin, "Rate 16/17 (0,6/6) Code", vol. 31, No. 8, Jan. 1989, pp. 21–23.

*Primary Examiner*—Michael Tokar
*Assistant Examiner*—Patrick Wamsley
*Attorney, Agent, or Firm*—Bret J. Petersen; Richard L. Donaldson

[57] ABSTRACT

Highly efficient, enhanced RLL and MTR constrained or modulation codes and a unified methodology for generating the same. The new codes also include partial error detection (PED) capability. RLL/PED code rates of 8/9, 16/17, 24/25 and 32/33 or higher are disclosed. The new generalized RLL/PED block coding schemes are derived with fixed length n: $n/(n+1)(d=0, k=n-1/l=n)$, $n/n+1(0,[n/2]/l=n+4)$ and $m/(n+1)(d=0, k=[n/2]/l=n)$ for $n \geq 5$ (where [ ]denotes the enteger part of the argument). The codes $n/(n+1)(0,[n/2]/l=n+4)$ are also shown in a concatenated ECC/modulation architecture, where the modulation decoder, capable of detecting bits in error, generates symbol byte erasures to boost the performance of the outer ECC decoder.

24 Claims, 7 Drawing Sheets

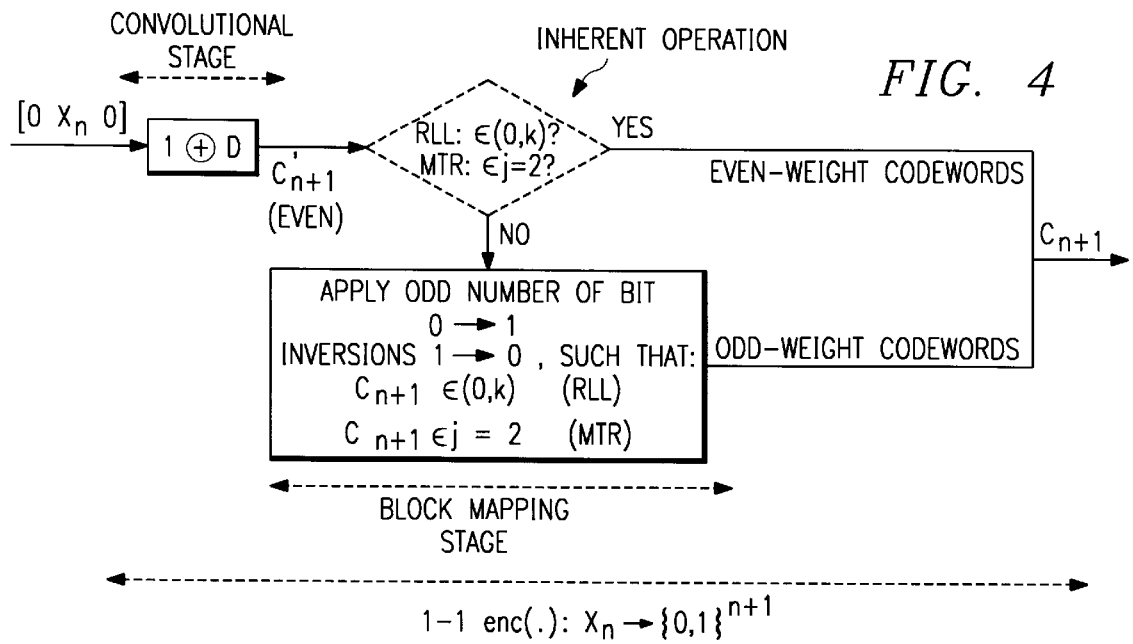
FIG. 4
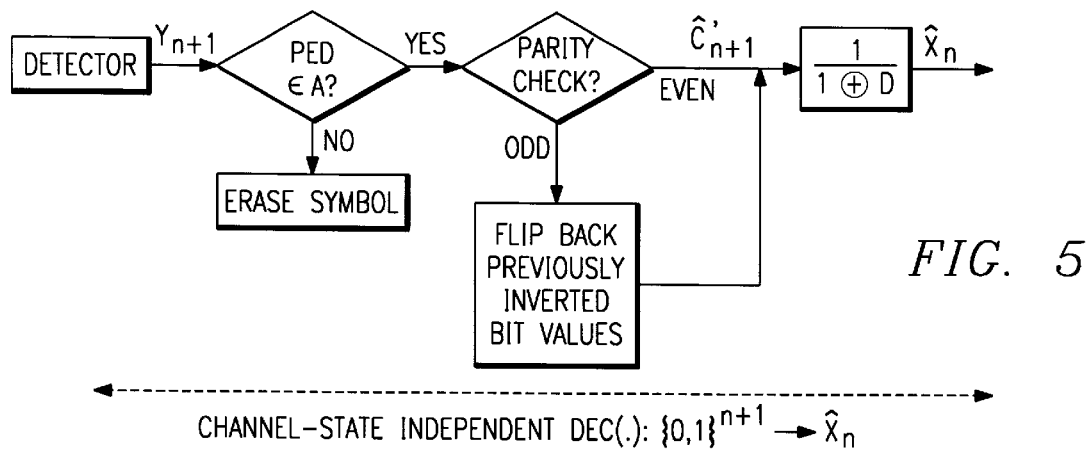
FIG. 5
FIG. 6

METHOD AND APPARATUS FOR HIGH-RATE N/N+1 LOW-COMPLEXITY MODULATION CODES WITH ADJUSTABLE CODEWORD LENGTH AND ERROR CONTROL CAPABILITY

This amendment claims priority under 35 USC § 199(e)(1) of provisional application number 60/068,016, filed Dec. 18, 1997.

FIELD OF THE INVENTION

This invention generally relates to digital communication systems such as those used in the read channel of computer hard disk drives or for optical recording. More particularly, it relates to a family of new constrained or modulation codes for a digital communications channel.

BACKGROUND OF THE INVENTION

An important digital baseband communication system is found in the read channel of a magnetic storage system of a conventional computer hard disk drive (HDD). HDD read/write channels use partial response maximum likelihood (PRML) techniques to increase the bit density on the disk. Uncoded binary data from a computer is not suitable for recording on a PRML disk drive because unconstrained computer data could contain long spans of adjacent zeros. Such long spans of zeros provides no timing or gain information for the read channel, thereby preventing the proper timing and gaintracking for the read back signal waveform. Encoding data to provide run length limited (RLL) data has therefore become common. RLL Coding schemes use (d,k) constraints which limit the minimum and maximum run lengths of zeros respectively, or alternatively they control the high and low frequency contents of the user data.

Conventional high-rate RLL (0,k) codes are highly complex for circuit implementation and relatively "blind" in terms of error detection during the demodulation process. The d, k constraints comprise the only properties of these codes exploitable for error control purposes. However, this specialized type of error is only a small subset of the total number of possible errors. Furthermore, the conventional codes are of fixed codeword length/code rate requiring complete redesign of the encoder/decoder for a higher code rate.

The design of modulation codes with coding gain for read channels in HDDs is mainly focused in two different directions, first, to enhance error/erasure control capabilities, and second, to enhance the detectors performance.

A. Enhance Error/Erasure Control Capabilities

Concatenation of conventional RLL with ECC can reduce the effectiveness of the ECC, especially with a sliding block encoder/decoder subject to limited error propagation. RLL codes with error-detecting capabilites which have been reported are also of a lower rate than the conventional 8/9, and 16/17 RLL codes.

For RLL(d=0,k/l) codes, optimal block codes with gated-partition logic and high rates such as 8/9 and 16/17 have been demonstrated while focusing on the k-constraint of the maximum run-length of consecutive 0s for timing recovery purposes, and the interleave constraint "l" to eliminate quasicatastrophic sequences. The very limited error control capability of the code is exclusively associated with the k, l-global and interleave constraints respectively. See U.S. Pat. No. 4,707,681 to Eggenberger and Patel, and Patel, A. M. "Rate 16/17(0,6/6) Code," IBM Tech. Disclosure Bull. 38, 8 1989; both incorporated herein by reference.

In "A class of (d,k) block codes with single error-correcting capability", Digests Intermag '97, by P. H Liu and Y. Lin, the design objective was a modulation encoder generating encoded sequences of a specific minimum distance with single error-correcting capability. However the obtained code rates are lower than those of the conventional RLL ones, and some of the reported code rates are in the order of 8/21, 8/28.

In "The (d,k) Subcode of a Linear Block Code", IEEE Trans. On Info. Thy., vol. 38, no. 4, pp. 1375–1382, July 1992, Papoutian and Kumar proposed that the block length of the Hamming subcode is kept as large as possible to avoid rate loss for a single-error correcting ECC/RLL code.

In "Error and Erasure Control (d,k) Block Codes", IEEE Trans. On Info. Thy, vol. 37, no. 5, September 1991; Ferreira and Lin demonstrate redundancy based on appended parity bits is used, or access to channel-side information is possible and sufficiently long codewords are assumed in order to construct high rate combined codes with single error correction capability.

Construction of systematic RLL codes capable of single error-detection causes rate loss and produces less efficient codes than nonsystematic ones. The required number of parity check bits attached to an RLL encoded sequence is equal to d+3. See "RLL codes for single error detection in the Magnetic Recording Channel", IEEE Trans. On Info. Thy., vol 41, no. 3, May 1995. This can be shown by starting with an RLL code of rate=n/m then the resulting final code rate will be equal to $$\frac{n}{m+d+3}.$$

For example, use of just one appended parity check bit would create RLL code rates in the order of n/(n+2) which are lower than n/(n+1).

In "Error Detecting Runlength-limited Sequences", IEEE Video, Audio & Data Recording, by K. A. S. Immink, it was stated that in order to alleviate the overhead on the code rate due to the appended parity, an increase of the codeword length should be applied (approximately 3 to 4 times larger than conventional RLL with the same rate) increasing however the system's probability of error. It was also proposed to choose the only odd or only even sequences (whichever would provide the needed number of codewords) satisfying d, k constraints, and apply parity checking in order to avoid addition of extra parity check bits with a code rate reduction effect. However, in the above, not all rates are feasible for every codeword length due to insufficient number of available codewords.

B. Enhance the Detector's Performance

MTR codes are of lower rate than RLL (up to maximum 6/7), while their objective is to limit the number of transitions to increase the $d_{min}$ between the generated sequence. Then a gain is produced at the $E^2PR4$ detector by eliminating the minimum distance error event. The reported 4/5, 5/6 and 6/7 MTR codes have made use of look-ahead encoders/ decoders, and there is an associated error-propagation problem. See B. Brickner and J. Moon, "Design of a rate 6/7 Maximum Transition Rate Code", IEEE Trans. On Magnetics, pp. 2749–2751, September 1997. Time varying MTR schemes are of maximum code rate equal to 8/9, requiring time-varying detector of higher complexity. The associated detector gain for both MTR and TMTR is at maximum equal to 2.2 dB for $E^2PR4$ systems. See W. Bliss, "An 8/9 Rate Time-varying Trellis code for high density magnetic recording", Digests Intermag '97.

SUMMARY OF THE INVENTION

The present invention provides a new family of highly efficient modulation codes and a methodology for their generation. These codes provide a more sophisticated demodulation decoder for improved error control reliability. The codes include RLL(0, k/l) codes with a combined PED capability to be concatenated with an outer ECC. Moreover, they are further enhanced over prior art schemes because, first the modulation RLL/PED codes own an increased list of constraints rather than just constraints pertaining to d, k, l only; second, they are characterized by simplicity and low complexity in their design irrespective of the codeword length n, or the code rate which is of the type $$\frac{n}{n+1},$$

∀n, i.e. the highest rate is obtained for any given codeword length. Note that in current systems, (concatenation with a low redundancy ECC), the overall rate is mainly determined by the modulation code rate which critically is to be maintained high. Finally, the encoder/decoder, the error-control equations, and the RLL's global k and interleave l-constraints are functions of the data word length n, so that an adjustable codeword length/code rate is produced as an additional desirable feature of the disclosed codes.

The present invention introduces enhanced RLL codes with PED capability at the highest possible rates of the type n/(n+1), i.e., rates equivalent to the conventional high-rate RLL codes. After a convolutional-type pre-encoding operation on the n-bit data word $X_n$, the produced n+1 bit pre-encoded output symbols $C'_{n+1}$ are manipulated in such way that the RLL or MTR modulation code constraints are satisfied without increasing the symbol's bit-length. The generated codewords $C_{n+1}$ possess more error-control capabilities additional to the d, k constraints of the conventional RLL modulation codes, to enhance the error detection capability of the modulation code. The decoder only observes the high-rate encoded binary sequences without making use of any channel-side information. Under certain conditions the demodulator knows "a-priori" what to expect, not to receive from the detector. This "a-priori" error-controllability is not simply an even/odd parity type checking, but it involves particular forbidden combinations of the detected bit values which emanate from complementing the encoder's mapping rules. Therefore, redundancy is introduced without lowering the rate.

In the encoders and decoders according to the present invention, both even and odd codewords are exploited simultaneously. Consequently, the number of available codewords is increased and sufficient to obtain RLL codes of any rate. Instead of attaching extra parity bits and lowering the rate to $$\frac{n}{n+1+\text{\# parity bits}},$$

an embedded parity scheme is obtained via manipulation of the available n+1 bits, to achieve the highest code rate n/n+1 for any given codeword length n+1. Therefore, the RLL/PED code rate=conventional RLL code rate, without paying the penalty of an impractical codeword length n enlargement. For the same fixed codeword length the new proposed schemes offer superior rates of 19/20 and 29/30 as compared to 12/20, 16/20, 27/30 (d=0 codes) obtained in based on an even or odd parity.

Another advantage is the very low complexity MTR/PED family of encoding/decoding schemes according to the present invention combine a detector gain of 2.2 dB for $E^2PR4$ systems and PED capability to enhance ECC performance, and are not subject to error-propagation effects.

An advantage of the present invention is codes of very high efficiency. The highest rates are achieved in both senses: a) Highest efficiency $$\frac{n}{n+1}$$

is obtained for any given codeword length n+1, b) the length n can increase so that the rate $$\frac{n}{n+1} \xrightarrow[n\to\infty]{} 1$$

as long as the constraints k, l do not take prohibitively large values. Obviously code rates as high as possible are required to increase the linear recording density in band-limited systems.

Further, the present invention's codes combine ease in implementation of the encoder/decoder due to their significantly reduced computational complexity irrespective of the rate or codeword length. This low complexity emanates from the obtained highly structured codewords. The block mapping dimensionality has been reduced down to 1-bit, 2-bit, 3-bit, etc.

Another advantage is Global RLL code design of any rate. Due to the design simplification of the higher fixed-rate codes n/(n+1) of large fixed symbol lengths n+1, a significant practical application for the adjustable rate RLL codes arises. It is the simplification of the redesign of the modulation encoder/decoder when a system upgrade at a higher rate code is required. The obtained closed form expressions for the encoder, decoder, error control equations and k, l constraints as functions of the codeword length and irrespective of its value, alleviate the need of redesigning the modulation encoder/decoder. Consequently, rate of 8/9, 16/17 can be easily extended to 24/25, 32/33 and in general to any n/(n+1) rate.

Another advantage is the decoder of the present invention modulation codes has enhanced PED capability. The new codes can partially and indistinguishably capture single drop-in, drop-out, bit-shifts as well as error bursts due to error propagation in the detector initiated by a single error.

Creation of error control patterns capable of capturing the detector's $d_{min}$ error events, ensures detection of a substantial amount of errors. This is highly desired to support the ECC, and the new codes obtain an overall superior performance for the combination of read channel/ECC.

Another advantage is that the parity check is generated internally within the n+1-tuple codeword without a need for any added parity check bits and consequently the proposed codes do not sacrifice rate in order to gain error control capability.

Another advantage is the segmented codeword-by-codeword based decoding is advantageous for protection against unlimited error propagation.

Another advantage is a simple code-rate programmable architecture is feasible, based on the single parameter data word length n, whereby for byte-oriented communication or storage systems n is an integer multiple of an 8-bit byte.

A further advantage is Adjustable RLL (ARLL): Multiple modes of an adjustable code rate would be suitable to be used as we move from the outer to the inner diameter of the disk and vice versa. Moving towards the inner ID (outer OD) diameter, the linear velocity is getting reduced (increased) and the PW-50 increases (decreases). The PW-50 is broader (narrower) at the ID (OD) while the data rate should stay constant. If the system is electronics speed-limited, then the channel frequency $f_c$ or equivalently the channel symbol period $T_c$ stays constant. Since the numerator PW50 increases (decreases) while denominator stays constant, the symbol density $$\frac{PW50}{T_c}$$

will necessarily be increased (reduced) for given UBD and code rate. By being capable to change the block length, the symbol density can be changed to counteract the diameter-induced effect. More specifically if the symbol density increases due to PW-50 broadening and exceeds the equalization range limits causing unacceptable noise enhancement, then by switching into a higher rate code the $T_c$ will increase preserving an approximately constant symbol density within the permissible equalization range. In general whenever equalization becomes insufficient, because high levels of noise enhancement are produced due to changes of the UBD target, then code rate adjustments can be the ultimate remedy.

Another advantage is the potential for channel quality performance monitoring via the enhanced error-control capabilities of the new codes.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 4 Illustrates the two-stage unified modulation encoder according to an embodiment of the present invention;

FIG. 5 Shows a block diagram of a demodulation decoder according to an embodiment of the present invention;

FIG. 6 Shows a block diagram of data polynomial $X_n(x)$ multiplication with 1+x;

DETAILED DESCRIPTION OF THE PREFERRED EMBODIMENTS

Figure 1:
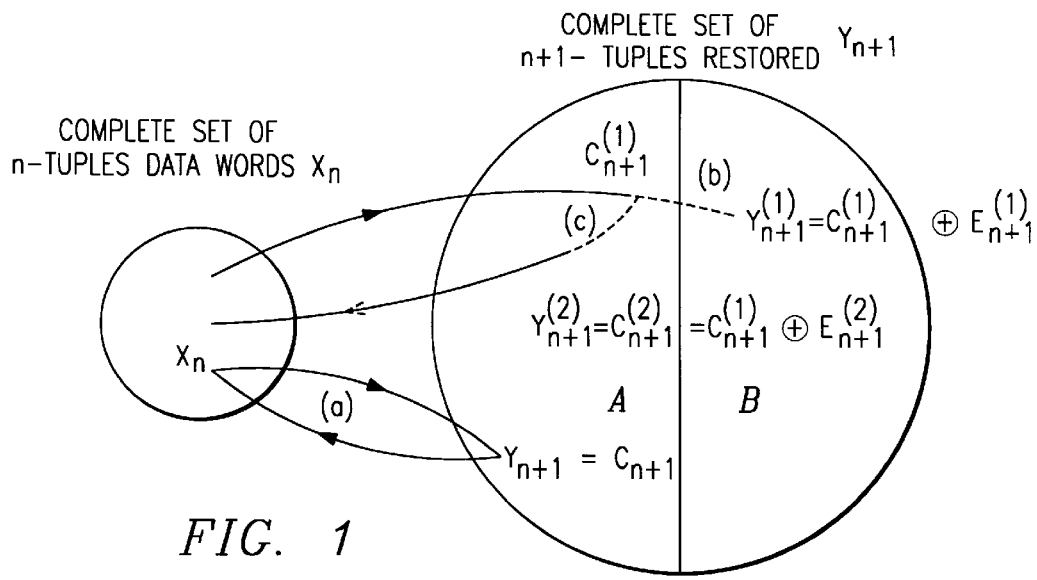
FIG. 1 Shows the possible received code words divided into two mutually exclusive sets and describes three possible scenarios for the restored codewords regarding decodability or error detectability.

A new unified code construction methodology for d=0 RLL/PED and j=2 MTR/PED codes, is described herein. Both coding schemes have been used to impose constraints on the maximum run length (consecutive "zeros") or the maximum transition run (consecutive "ones") respectively in the data sequence. The objective for the insertion of "ones" (RLL) is to guarantee sufficient transitions for timing recovery purposes, while the limitation in the number of consecutive NRZI transitions to j=2 (MTR) has a minimum distance enhancing effect for $E^2PR4$ systems, as well as a reduction of the media noise level due to the less densely packed transitions.

The Overall Parity Check: A Motivation for Construction of Highly-Efficient Modulation Codes The overall parity check code is a (n, n+1) ECC code with redundancy of 1. Therefore, the produced code rate is equal to n/(n+1) which coincides with the target rate for the conventional 8/9, 16/17 RLL; the 4/5, 5/6, 6/7 MTR codes; and the 8/9 TMTR. This high rate code comprises the initial motivation for the development of the present invention modulation codes and construction techniques.

A multiplication of the $(n-1)^{th}$-degree data word polynomials $X_n(x)$ with the $1^{st}$ degree polynomial 1+x, generates $n^{th}$-degree polynomials $C'_{n+1}(x)$ or equivalently n+1-tuples codewords $C'_{n+1}$ of even weight only. As a notation example the 8-tuple codeword $C_8$=[10010110] is associated with the $7^{th}$-degree polynomial $C_8(x)=x^7+x^4+x^2+x$. Let us define for any data word $X_n$ the corresponding 0-padded data word by appending one 0 at the beginning and at the end of the data word $X_n$: [0 $X_n$ 0]. Note that multiplication of the data word polynomial $X_n(x)$ with 1+x is equivalent with convoluting the corresponding 0-padded data word [0 $X_n$ 0] with 1⊕D (see FIG. 6 which illustrates polynomial multiplication of 1+x using the serial bit delay operator "D"). Two properties of the 1+x or 1⊕D transformation in relation to the design of modulation codes are listed in Table 1.

TABLE 1

Desired Properties for Encoded Sequences achieved via 1⊕D Transformation

| RLL(d, k) | MTR(j, k) |
|---|---|
| ... 10101 ... $\xrightarrow{1+x}$ ... 11111 ... | ... 11111 ... $\xrightarrow{1+x}$ ... 100001 ... |
| Transitions are spaced closer. The k-constraint is reduced which is beneficial for timing recovery purposes. | Consecutive transitions (independent of the total number) are spaced apart with twofold benefit: a) Satisfy j = 2 MTR constraint to eliminate the minimum distance error event for an EEPR4 system b) Media noise is reduced by spacing transitions less densely |

Erasures

The n-tuples information symbols $X_n$, are encoded into the n+1-tuples modulated symbols $C_{n+1}$. The ECC capability is significantly enhanced when the error locations are designated by flags provided by the demodulator. A byte in error is undetermined in both location and value, while an erased byte is an error of known location only. An error can be notated as (L=?, V=?) while an erasure is (L=#, V=?), where L and V denote location and value respectively.

The new code construction method creates a symbol alphabet A described via the encoder's mapping rules. If the detected restored codeword does not belong to the demodulator's alphabet $Y_{n+1} \notin A$ or equivalently if it does not satisfy the encoding rules to secure decodability, then the demodulator decides for a symbol erasure (L=#, V=?). In general, the complete set of n+1-tuples can be partitioned into two mutually exclusive sets of received codewords by the demodulation decoder:

1. Set A, of valid codewords, defined by the encoder's mapping rules.
2. Set B, of invalid but detectable codewords, specified by the decoder's error-control rules.

FIG. 1 illustrates: (a) Correct encoding/decoding, (b) channel error creates a detectable invalid codeword, and (c) the channel fabricates a valid codeword (undetectable error). Where $C_{n+1}$ denotes the transmitted or recorded codeword, $Y_{n+1}$ denotes the received or restored or detected codeword at the decoder's input, and $E_{n+1}$ is the error pattern between the recorded and restored codewords, i.e. $E_{n+1}=C_{n+1}\oplus Y_{n+1}$; existence of "one" in the error pattern $E_{n+1}$ indicates a mismatch between stored and restored codewords and implies an error during the detection of the codeword $Y_{n+1}$.

Figure 2:
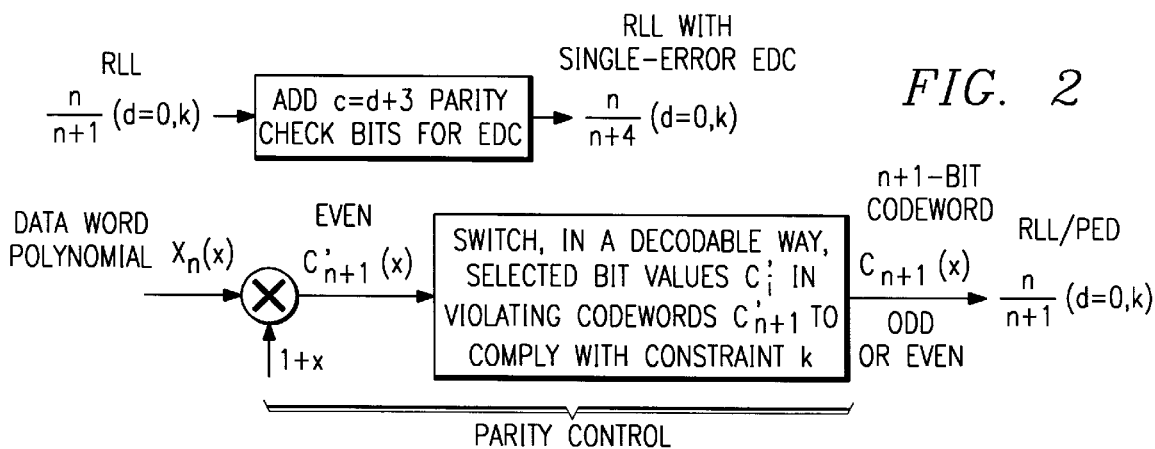
FIG. 2 Illustrates a comparison of the Error detection capability using appended parity bits according to the prior art, (top), and the present invention having RLL codes with embedded parity control (bottom)

Parity-checking Aided Modulation Encoders/Decoders vs. Code Rate/Codeword Length In some prior art methods for constructing systematic RLL codes with single error-detection capability, a number of parity check bits c is added at the end of the RLL encoded codeword to produce rates of n/(n+1+c). For example, a c=d+3=3 rule for the 8/9(0,4) and 16/17(d=0,k=6) would lower the rates to 8/12 and 16/20 respectively. In contrast, the code construction techniques according to the present invention maintain very efficient rates of 8/9 and 16/17, because the parity control is embedded in the codewords by inverting in a controlled way properly chosen bits within the codeword. Therefore the code's overhead is avoided since the parity instead of being attached it is internally created within the codeword. FIG. 2 illustrates a comparison of the Error detection capability of the prior art, Construction of systematic RLL codes with appended-parity (top), and the present invention having RLL codes with embedded parity (bottom).

In general, as the number of "attached parity"-based imposed constraints increases in traditional systems, the code rate tends to be reduced. In the present invention codes the constraint k is slightly relaxed, and additional error-control constraints are incorporated without changing the final rate of the code from the initial rate of n/(n+1) of the conventional RLL codes.

A second and more intuitive interpretation is that the higher levels on n/(n+1) code rates are obtained via trading off the strict condition of a single-error correction or single-error detection capability to gain instead PED capability only. PED capability is defined as error detection in a received codeword without being able to identify all possible errors, error type (drop-in, drop-out, bit shifts, burst etc.), or the exact bit error locations.

The new present invention codes are unrestricted with respect to the used codeword lengths which can take values identical to the corresponding conventional RLL ones as well as larger values reaching the optimum efficiency in the limit $$\frac{n}{n+1} \xrightarrow[n\to\infty]{} 1.$$

System Architecture

The new modulation schemes become more powerful when cascaded with an outer ECC code. The new demodulator is equipped with an alphabet A of admissible codewords defined by the set of constraints imposed by the modulating encoder, which all the stored/transmitted codewords $C_{n+1}$ must satisfy. The ECC decoder's performance is enhanced when operating on erased symbols generated by the demodulator and at the same time the rate of the modulation code remains high n/(n+1), higher than the rates obtained in prior art coding systems.

Figure 3:
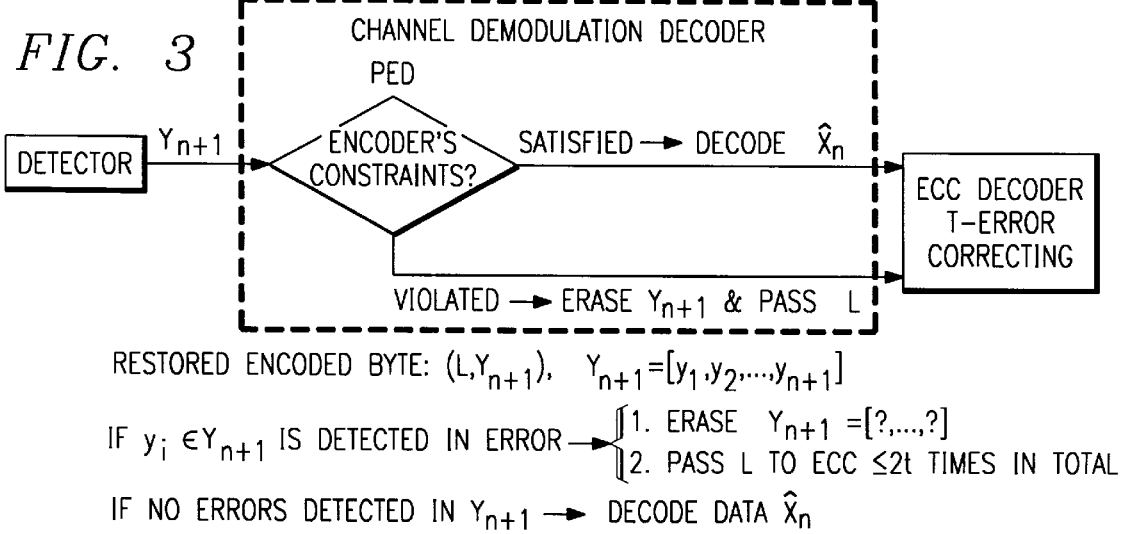
FIG. 3 Shows a block diagram of the channel demodulation decoder with partial error detection (PED) capability followed by an outer ECC decoder.

The demodulation decoder observes the restored high-rate encoded binary sequences $Y_{n+1}$ and checks the encoder's list of constraints. Then it either decodes the restored codeword $Y_{n+1}$ back to the initial data word $\hat{X}_n$, or it detects a constraint violation and generates an erasure byte. Instead of attempting to correct the single or multiple bit errors, the demodulator erases the whole byte, i.e. if in the $L^{th}$ received byte $Y_{n+1}^{(L)}$ an error-control rule violation is detected, then all the bit values $Y_i$, i=1, ..., n of the $L^{th}$ byte are erased $Y_{n+1}^{(L)}=[??\ldots?]$. The location L of the erased symbol $Y_{n+1}^{(L)}$ is the only information passed from the demodulation decoder to the ECC decoder. See FIG. 3.

The erasure-correcting capability is equal to 2t for an ECC with error-correcting capability t. A counter can be deployed to identify the erasures locations and count the number of produced erasures. The ECC decoder stops decoding if the upper bound of the number of erasures supported by the ECC is being exceeded.

Unified Construction of RLL and MTR Codes with PED Capability Using Overall Parity Checking The new codes increase the number of checking constraints in addition to the d, k, l constraints for more powerful error detection capability while maintaining at the same time the desired higher code rate of n/(n+1). The unified construction methodology is described below with reference to Table 2.

Within the received codeword $Y_{n+1}$, there is a number of selected bits $y_i, y_k, y_l, \ldots y_m$ which control the additional constraints, and determine whether regular decoding of a valid codeword, or erasure of the received invalid current symbol will take place. It is obvious that in order to increase the probability of error detection it would be preferred if the constraints were functions of the smallest possible number of check bits, since the larger the number of the constraint's check bits the lower the probability that the check pattern will be formed by the random errors. Thus the PED capability increases, as the number of check bits per constraint decreases, while the number of independent constraints imposed by the encoder increases. In summary, ideally we would like to form many short constraints. Note that during the construction procedure of the new codes, it was observed that by relaxing constraint k, the necessary number of check bits per constraint can be further reduced.

The codeword validity checking constraints can detect isolated random errors or errors in bursts, i.e. assume that $y_i=0, y_{i+1}=0$ is an error-checking condition. This condition can be met due to a single error $y_i=1 \rightarrow 0$ & $y_{i+1}=0$ or $y_i=0$ & $y_{i+1}=1 \rightarrow 0$, or due to an error burst $y_i=1 \rightarrow 0, y_{i+1}=1 \rightarrow 0$.

TABLE 2

Adjustable modulation codes with PED, w/o memory or anticipation; A unified construction methodology

| RLL (0, k) | MTR (j = 2) |
|---|---|

Encoding

1. Multiply n – 1$^{th}$ order data word polynomial $X_n(x)$ with $1 + x : X_n(x) \times (1 + x) \rightarrow C_{n+1}'(x)$ n$^{th}$ order pre-encoded even-weight codeword polynomials;
   or equivalently convolve the 0-padded n-tuples $X_n$ with $[0\ X_n\ 0\ *(1 \oplus D) \rightarrow C_{n+1}'$ n + 1-tuples codewords
2. For those pre-encoded codewords polynomials $C_{n+1}'(x)$ which violate the constraint k for RLL or j for MTR, invert an odd number of polynomial coefficients $\rightarrow C_{n+1}(x)$ satisfies k or j;
   or equivalently an odd number of bits within $C_{n+1}' \xrightarrow{\text{odd \# of bit inversions}} C_{n+1}$ codeword satisfies k or j

| | |
|---|---|
| 0 → 1: limits the maximum run length of "zeros"; There is one 1 → 0 inversion when the odd number of inversions is > 1 (see Table 3). | 1 → 0: limits the maximum transition run of "ones"; There are 2 0 → 1 inversions (see special words mapping described below). |

Decoding

1. Check the parity of the received codewords $Y_{n+1}(x)$; If even, then $\hat{C}_{n+1}'(x) = Y_{n+1}(x)$ and go to 3.
2. Invert back to their initial value the reversed bits or coefficients of the odd-parity restored codewords $Y_{n+1}(x) \xrightarrow{\text{Reverse inversions}} \hat{C}_{n+1}'(x)$ 3. Divide all the estimated n + 1-bit codewords $\hat{C}_{n+1}'(x)$ with $1 + x : C_{n+1}'(x) \times \dfrac{1}{1+x} \rightarrow$ Restore the n – 1$^{th}$ order data word polynomials $\hat{X}_n(x)$;
   Equivalently $\hat{C}_{n+1}' * \dfrac{1}{1 \oplus D} \rightarrow$ Restore the nbit data words $\hat{X}_n$ A feasibility investigation regarding code existence of rate equal to n/(n+1) can start by: 1) Finding the number of needed codewords N, 2) specifying acceptable constraints k, l, and 3) finding the number of available legal codewords A, which must exceed or at least be equal to the number of needed codewords, i.e. A≧N. During the new code construction the initial objective was to secure code rate of n/(n+1) with d=0 constraint, and leave the k, l constraints flexible. Some of the principles pursued by the new code construction methodology are:

1. Embedded parity control, to preserve the highest rate n/(n+1) independent of the codeword length.

2. Application of the overall ECC parity check transform 1+x, to generate n/(n+1) code rates and control the parity.

3. Usage of both even and odd codewords, to increase the number of available valid codewords and make feasible codes of any rate of the type n/(n+1), $\forall_n$.

A Code Construction Domain: Overall Parity Checking with Conditional Bit Inversions (OPCBI)

The encoding procedure in the present invention has two stages as illustrated in FIG. 4. First there is a convolutional stage $1 \oplus D$ applied on every data word (on a word by word basis as shown in FIG. 6) n-tuples→n+1-tuples (even-weighted), Second, Block mapping via conditional bit inversions, to comply with the RLL d, k constraints. The objective is a block decodable causal/memoryless block code. The encoder function enc(.) is 1-to-1 mapping from a set of n-tuples messages $X_n$ onto the set of n+1-tuples codewords $C_{n+1}$. The decoder functions dec(.) does not use memory or anticipation. Encoding (decoding) is performed based on the current incoming data word (codeword) only: $C_{n+1}{}^j = \text{enc}(X_n{}^j) \forall j$, and $X_n{}^i = \text{dec}(C_{n+1}{}^i) \forall i$. That limits an otherwise unbounded error propagation within the finite length of one data word (codeword) only.

The encoder creates an alphabet A of admissible n+1-tuples symbols by the demodulation decoder, which includes:

1. A subset of even-weight codewords that pre-satisfy the target constraints $\in$ A.

2. A subset of the odd-weight codewords (those which satisfy the new encoder's additional constraints) $\in$ A. This subset of odd-weight codewords is obtained after manipulating appropriately the pre-encoded even-weight codewords $C'_{n+1}$ which violated the target constraints.

Then the decoding is based on the principle that the odd-weighted codewords are being generated in a controlled way to satisfy the target modulation constraints d, k or j. On the other hand, the convolved-only even-weighted codewords, which initially pre-satisfy the target RLL or MTR constraints, remain unmodified, and their decoding is straightforward via application of inverse deconvolution operation $1/(1 \oplus D)$.

Let us assume the encoding of two n-tuple data words $X_n{}^i$, $X_n{}^j$ into two n+1- tuple codewords $C_{n+1}{}^i$, $C_{n+1}{}^j$ respectively. There are two fundamental properties of the mapping that need to be satisfied in order to guarantee correct decoding: 1. Uniqueness, and 2. totality. More mathematically, the necessary and sufficient condition for 1:1 mapping between n-tuples data words $X_n$, and n+1-tuples codewords $C_{n+1}$, is the following:

$$\forall X_n^i, X_n^j X_n^i \xrightarrow{enc(.)} C_{n+1}^i, X_n^j \xrightarrow{enc(.)} C_{n+1}^j,$$

$$enc(X_n^i) = C_{n+1}^i \neq enc(X_n^j) = C_{n+1}^j \overset{iff}{\Longleftrightarrow} \overset{iff}{\Longleftrightarrow} dec(C_{n+1}^i) = X_n^i \neq X_n^j dec(C_{n+1}^j)$$

Figure 7:
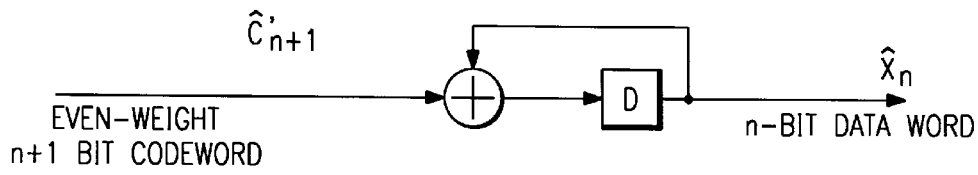
FIG. 7 Shows a block diagram of data polynomial $X_n(x)$ division by 1+x.

FIG. 5 illustrates a block diagram of a demodulation decoder according to the present invention, where $\hat{C}'_{n+1}$ stands for the estimate of the original convolution-based pre-encoded $C'_{n+1}$. FIG. 6 shows a block representation of polynomial multiplication by 1+x: $C'_{n+1}(x) = (1+x)X_n(x)$. Similarly, FIG. 7 shows a block representation of polynomial division by 1+x:

$$\hat{X}_n(x) = \left(\frac{1}{1+x}\right)\hat{C}'_{n+1}(x).$$

A. The q-bit Partitioning of the n+1-tuple Pre-encoded Codeword $C'_{n+1}$

The mapping dimensionality is determined by the maximum number of bits used to partition the pre-encoded codeword $C'_{n+1}$, i.e., we select a q-bit subset of the codeword's total n+1 bits to: 1. Exhaust the complete set of pre-encoded codewords $C'_{n+1}$ with all possible q-bit combinations, and screen the pre-encoded codewords $C'_{n+1}$ for any constraint violations, and 2. control the changes of an odd number of bit values so that the constraints k, l (RLL) or j (MTR) are satisfied, while transforming at the same time the even-to-odd weighted codewords. Therefore the dimensionality of the block-mapping domain is significantly reduced down to 1-, 2-, 3-, 4-bit etc.

B. The 16/17(0,8) Code Construction Example; Codeword Structuring via Using Conditional Bit Inversions for Parity Control Using the 2-Bit Partitioning Domain The 2-bit partitioning of the convolved pre-encoded codeword $C'_{n+1}$ and the subsequent block mapping to generate the codeword $C_{n+1}$ are illustrated below. There are two types of conditional mappings which take place depending on the odd number of bit inversions: Type I, where the number of inversions is odd and>1, i.e. 3, 5 etc., Type II, where the number of inversions is=1. The PED error detection capability emanates from Type II mapping only.

Table 3 illustrates the conditional block mapping for the 2-bit example, assuming the n+1-bit pre-encoded codeword $C'_{n+1}$:

TABLE 3

Very Low Complexity Encoder $$\frac{n}{n+1}\left(0, k=\frac{n}{2} \Big/ I=n+4\right) \text{for } n=8, 16, 24, 32, \ldots$$

1st Stage:

Polynomial domain:

$$X_n(x) \times (1+x) \to C'_{n+1}(x) = 0 + c'_i x + \underbrace{000\ldots000}_{\frac{n}{2}-1} + c'_{i+\frac{n}{2}} x^{\frac{n}{2}+1} + \underbrace{00\ldots00}_{\frac{n}{4}} + c'_{i+\frac{3n+4}{4}} x^{\frac{3n+4}{4}+1} + \underbrace{0\ldots 0}_{2(\frac{n}{8}-1)},$$

or equivalently Binary domain:

$$[0X_n 0] * (1 \oplus D) \to C'_{n+1} = [0, c'_i, \underbrace{000\ldots000}_{\frac{n}{2}-1}, c'_{i+\frac{n}{2}}, \underbrace{00\ldots00}_{\frac{n}{4}}, c'_{i+\frac{3n+4}{4}}, \underbrace{0\ldots 0}_{2(\frac{n}{8}-1)}]$$

If $C'_{n+1}$ does not satisfy constraint k, then apply 2-bit partitioning:

2nd Stage:

|  |  |  |  | Odd # of bit |
|---|---|---|---|---|
| Block mapping via conditional bit (or coefficient) inversions: |  |  |  | (or coefficient) inversions |

| if | $c'_i$ | $c'_{i+\frac{n}{2}}$ |  |  |
|---|---|---|---|---|
|  | 1 | 1 | is an allowed state (a) → Form $C_{n+1}$ | 3 |
|  | 0 | 0 | $\xrightarrow{\text{Type I}}$ Invert $\overline{c_i = \sim c'_i, c_{i+\frac{n}{2}} = \sim c'_{i+\frac{n}{2}}, c_{i+\frac{3n+4}{4}} = \sim c'_{i+\frac{3n+4}{4}}}$ | 1 |
|  | 0 | 1 | $\xrightarrow{\text{Type II}}$ Set $c_{i-1} = 1$ | 1 |
|  | 1 | 0 | $\xrightarrow{\text{Type II}}$ Set $c_{i+\frac{n}{2}+1} = 1$ |  |

Figure 8:
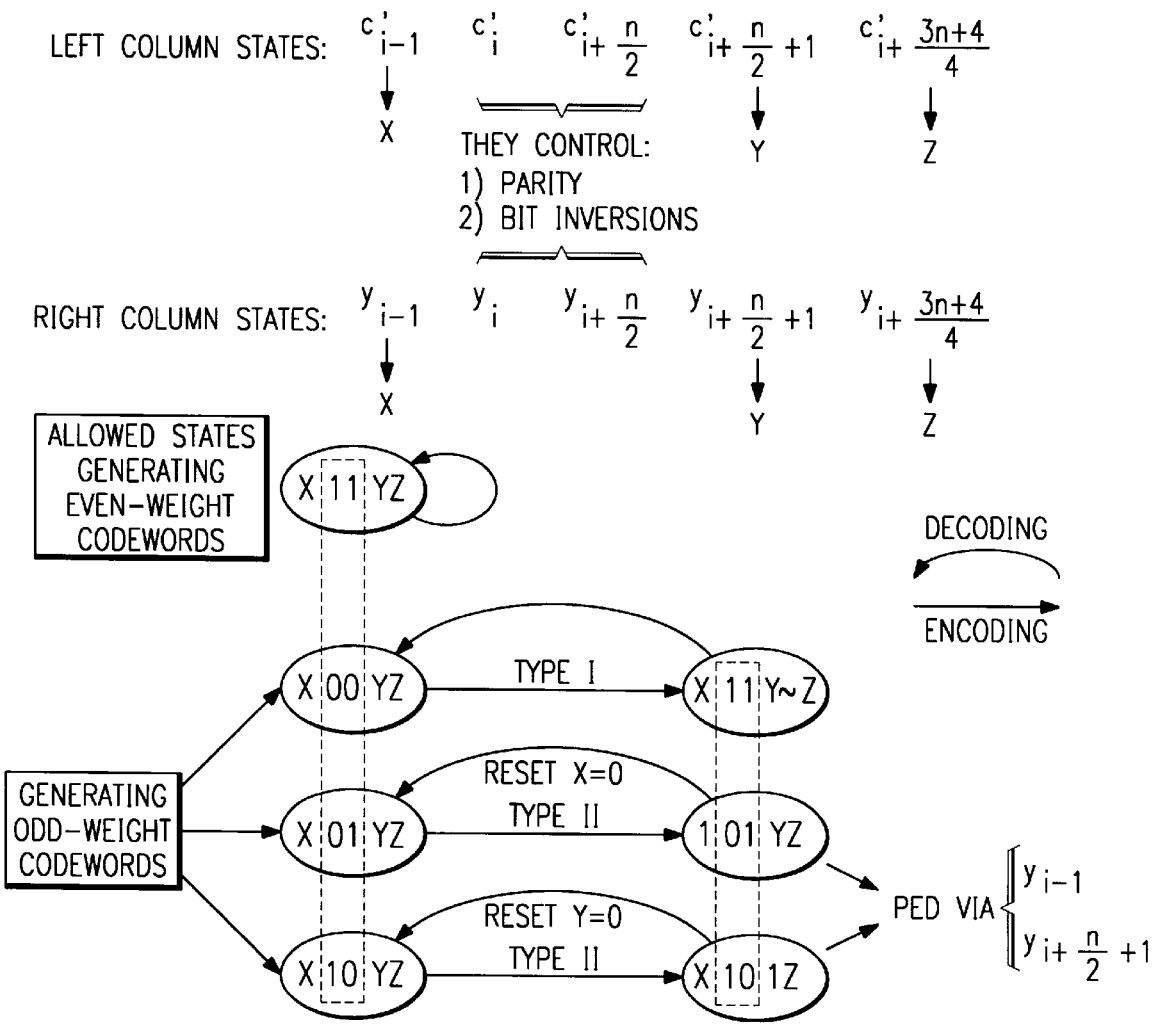
FIG. 8 The state-transition diagram describing the conditional bit inversions during encoding/decoding; X, Y, Z are "don't care values"

In the above table, an allowed state is defined as that state of $c'_i$, $c'_{i+n/2}$ where there is no need for conditional block mapping without violating the target k-constraint. Consequently, the resulted codeword $C_{n+1}$ has still an even weight. The state of $c'_i$, $c'_{i+n/2}$ determines the parity of the generated codeword $C_{n+1}$ as well as the encoder's mapping rules, while the state of $y_i$, $y_{i+n/2}$ identifies parity of the restored codeword $Y_{n+1}$ and determines decoding rules (see FIG. 8). That state comprises the condition that an odd number of bit inversions is dependent upon, in order to satisfy constraint k after all possible codeword concatenations. Finally, note that any other sample within the range $[c'_{i+n/2+2}\, c'_{i+n-1}]$ can be used as the third controlling sample, instead of the sample $$c'_{i+\frac{3n+4}{4}},$$

without affecting the resulted value of k. It can be easily shown that the above mapping generates a k=[n/2] constraint for an n+1 codeword length. Note that there are many alternatives to the above transformation choices, i.e., instead of setting bit $c_{i+n/2+1}=1$ the $c_{i+n/2-1}=1$ could be set etc. Depending on the transformation choice, various code versions of approximately equivalent performance can be produced. Finally, if the encoder's controlling bits $c_i$, $c_{i+n/2}$ are shifted cyclically modulo (n+1) within the codeword for i=1, ..., n+1, then n+1 codes are generated, which are equivalent w.r.t. the rate n/n+1 and the constraint k=[n/2].

Using the 5-Bit Partitioning Domain

Tables 4, 5a illustrate two alternative solutions for encoding $$\frac{n}{n+1}\left(0, d=\frac{n}{2} \Big/ I=n\right)$$

using the 5-D partitioning domain. Table 5b illustrates a decoding example for the encoding example of FIG. 5a.

TABLE 4

$$C_{n+1} = \left[c'_i \underbrace{00\ldots 0}_{\frac{n}{4}-1} c'_{i+\frac{n}{4}} \underbrace{00\ldots 0}_{\frac{n}{4}-1} c'_{i+\frac{n}{2}} \underbrace{00\ldots 0}_{\frac{n}{4}-1} c'_{i+\frac{3n}{4}} \underbrace{00\ldots 0}_{\frac{n}{4}-1} c'_{i+n}\right],$$

$$\text{for } n = \begin{cases} 8 \Rightarrow 8/9(0, 4) \\ 16 \Rightarrow 16/17(0, 8) \\ 24 \Rightarrow 24/25(0, 12) \\ 32 \Rightarrow 32/33(0, 16) \end{cases}$$

Conditional block mapping Via conditional bit inversions:

TABLE 4-continued

| if $c'_i$ | $c'_{i+\frac{n}{4}}$ | $c'_{i+\frac{n}{2}}$ | $c'_{i+\frac{3n}{4}}$ | $c'_{i+n}$ | → Form $C_{n+1}$ | Odd # of bit inversions: |
|---|---|---|---|---|---|---|
| 1 | 1 | 1 | 1 | 1 | allowed state(a) | 5 |
| 0 | 0 | 0 | 0 | 0 | $\xrightarrow{\text{Type I}}$ (a) 1 1 1 1 1 | |

$A_1$: {1 out of the 5 samples = 0} all 5 states are allowed
$A_2$: {2 out of the 5 samples = 0}
all states are allowed except of those with 2 zeros in the row:

| | | | | | | |
|---|---|---|---|---|---|---|
| 0 | 0 | 1 | 1 | 1 | $\xrightarrow{\text{Type II}}$ Set $c_{i+\frac{n}{4}-1} = 1$ | 1 |
| 1 | 0 | 0 | 1 | 1 | $\xrightarrow{\text{Type II}}$ Set $c_{i+\frac{n}{2}-1} = 1$ | 1 |
| 1 | 1 | 0 | 0 | 1 | $\xrightarrow{\text{Type II}}$ Set $c_{i+\frac{n}{2}+1} = 1$ | 1 |
| 1 | 1 | 1 | 0 | 0 | $\xrightarrow{\text{Type II}}$ Set $c_{i+\frac{3n}{4}+1} = 1$ | 1 |

The 6 allowed states: 0 1 1 1 0, 0 1 1 0 1, 0 1 0 1 1,
1 1 0 1 0, 1 0 1 1 0, 1 0 1 0 1
$A_3$: {3 out of the 5 samples = 0}

| | | | | | | |
|---|---|---|---|---|---|---|
| 1 | 0 | 0 | 0 | 1 | $\xrightarrow{\text{Type II}}$ Set $c_{i+\frac{n}{2}-1} = 1$ or $c_{i+\frac{n}{2}-1} = 1$ | 1 |
| 0 | 1 | 1 | 0 | 0 | $\xrightarrow{\text{Type II}}$ Set $c_{i+\frac{3n}{4}+1} = 1$ | 1 |

The remaining 6 cases are mapped onto the 6 allowed states of $A_2$   1, 3, or 5

| | | | | | | |
|---|---|---|---|---|---|---|
| 0 | 0 | 0 | 1 | 1 | $\xrightarrow{\text{Type I}}$ 0 1 1 1 0 | 3 |
| 0 | 0 | 1 | 0 | 1 | $\xrightarrow{\text{Type I}}$ 0 1 0 1 1 | 3 |
| 0 | 1 | 0 | 0 | 1 | $\xrightarrow{\text{Type II}}$ 0 1 1 0 1 | 1 |
| 1 | 1 | 0 | 0 | 0 | $\xrightarrow{\text{Type II}}$ 1 1 0 1 0 | 1 |
| 1 | 0 | 1 | 0 | 0 | $\xrightarrow{\text{Type II}}$ 1 0 1 1 0 | 1 |
| 1 | 0 | 0 | 1 | 0 | $\xrightarrow{\text{Type I}}$ 1 0 1 0 1 | 3 | or an alterative mapping is shown in the following Table 5
$A_4$: {4 out of the 5 samples = 0}; 5 mapping cases:

$A_4 \xrightarrow{\text{Type I}} A_1$   3 or 5

TABLE 5a $$C_{n+1} = \left[ c'_i \underbrace{00 \ldots 0}_{\frac{n}{4}-1} c'_{i+\frac{n}{4}} \underbrace{00 \ldots 0}_{\frac{n}{4}-1} c'_{i+\frac{n}{2}} \underbrace{00 \ldots 0}_{\frac{n}{4}-1} c'_{i+\frac{3n}{4}} \underbrace{00 \ldots 0}_{\frac{n}{4}-1} c'_{i+n} \right],$$

for n = $\begin{cases} 8 \Rightarrow 8/9(0,4) \\ 16 \Rightarrow 16/17(0,8) \\ 24 \Rightarrow 24/25(0,12) \\ 32 \Rightarrow 32/33(0,16) \end{cases}$ Conditional block mapping via conditional bit inversions:

| if $c'_i$ | $c'_{i+\frac{n}{4}}$ | $c'_{i+\frac{n}{2}}$ | $c'_{i+\frac{3n}{4}}$ | $c'_{i+n}$ | → Form $C_{n+1}$ | Odd # of bit inversions: |
|---|---|---|---|---|---|---|
| 1 | 1 | 1 | 1 | 1 | allowed state(a) | |

$A_1$: {1 out of the 5 samples = 0} all 5 states are allowed

TABLE 5a-continued $A_2$: {2 out of the 5 samples = 0} all states allowed except of those with 2 zeros in the row
$A_3$: {3 out of the 5 samples = 0} if $\left(c'_i = 0 \ \& \ c'_{i+\frac{n}{4}} = 0 \ \& \ c'_{i-n} = 1 \ \& \ \left(c'_{i+\frac{n}{2}} = 1 \text{ or } c'_{i+\frac{3n}{4}} = 1\right)\right) \Rightarrow$ Set $c_{i+\frac{n}{4}-1} = 1$     1

0 0 1 1 1

0 0 0 1 1 $\xrightarrow{\text{Type II}}$ Set $c_{i+\frac{n}{4}-1} = 1$     1

0 0 1 0 1 if $\left(c'_i = 1 \ \& \ c'_{i+\frac{n}{4}} = 0 \ \& \ c'_{i+\frac{n}{2}} = 0 \ \& \ \left(c'_{i+\frac{3n}{4}} = 1 \text{ or } c'_{i+n} = 1\right)\right) \Rightarrow$ Set $c_{i+\frac{n}{2}-1} = 1$     1

1 0 0 1 1

1 0 0 1 0 $\xrightarrow{\text{Type II}}$ Set $c_{i+\frac{n}{2}-1} = 1$     1

1 0 0 0 1 if $\left(c'_{i-\frac{3n}{4}} = 0 \ \& \ c'_{i+n} = 0 \ \& \left(\left(c'_{i+\frac{n}{4}} = 1\right) \& \left(c'_i = 1 \text{ or } c'_{i+\frac{n}{4}} = 1\right) \& \left(c'_i = 1 \text{ or } c'_{i+\frac{n}{2}} = 1\right)\right)\right) \Rightarrow$ Set $c_{i+\frac{3n}{4}+1} = 1$     1

1 1 1 0 0

1 1 0 0 0 $\xrightarrow{\text{Type II}}$ Set $c_{i+\frac{3n}{4}+1} = 1$     1

1 0 1 0 0

0 1 1 0 0 if $\left(c'_{i+\frac{n}{4}} = 1 \ \& \ c'_{i+\frac{n}{2}} = 0 \ \& \ c'_{i-n} = 1 \ \& \ \left(c'_i = 0 \text{ or } c'_{i+\frac{3n}{4}} = 0\right)\right) \Rightarrow$ Set $c_{i+\frac{n}{2}+1} = 1$     1

1 1 0 0 1

0 1 0 1 1 $\xrightarrow{\text{Type II}}$ Set $c_{i+\frac{n}{2}+1} = 1$     1

0 1 0 0 1 if $\left(c'_i = 0 \ \& \ c'_{i+\frac{n}{4}} = 0 \ \& \ c'_{i+\frac{n}{2}} = 0 \ \& \ c'_{i+\frac{3n}{4}} = 0\right)$ or $\left(c'_{i+\frac{n}{4}} = 0 \ \& \ c'_{i+\frac{n}{2}} = 0 \ \& \ c'_{i+\frac{3n}{4}} = 0 \ \& \ c'_{i+n} = 0\right)$ or $\left(c'_i = 0 \ \& \ c'_{i+\frac{n}{4}} = 0 \ \& \ c'_{i+n} = 0\right)$ or $\left(c'_i = 0 \ \& \ c'_{i+\frac{n}{2}} = 0 \ \& \ c'_{i+\frac{3n}{4}} = 0 \ \& \ c'_{i+n} = 0\right) \Rightarrow$ Invert $c'_i = \sim c'_i, \ c'_{i+\frac{n}{4}} = \sim c'_{i+\frac{n}{4}}, \ c'_{i+\frac{n}{2}} = \sim c'_{i+\frac{n}{2}}, \ c'_{i+\frac{3n}{4}} = \sim c'_{i+\frac{3n}{4}}, \ c'_{i+n} = \sim c'_{i+n}$     5

0 0 0 0 0     $\xrightarrow{\text{Type I}}$   (a) 1 1 1 1 1     5

$A_1$:{4 out of the samples = 0}     $\xrightarrow{\text{Type I}}$   $A_1$

45

TABLE 5b 5-bit Partitioning Decoder $\frac{n}{n+1}\left(0, k = \frac{n}{2} \ / \ I = n\right)$ 1. Parity check of the restored codeword $Y_{n+1}$; If even, the $\hat{C}_{n+1} = Y_{n+1}$ and go to step 3.
2. Condition block decoding of odd – weight restored codewords $Y_{n+1}$ only $\to \hat{C}_{n+1}$ a) if $\left(y_i = 0 \ \& \ y_{i+\frac{n}{4}} = 0 \ \& \ y_{i+n} = 1 \ \& \ \left(y_{i+\frac{n}{2}} = 1 \text{ or } y_{i+\frac{3n}{4}} = 1\right)\right) \& \ y_{i+\frac{n}{4}-1} = 1 \Rightarrow$ Invert $y_{i+\frac{n}{4}-1} = \sim y_{i+\frac{n}{4}-1}$ elseif $\left(y_i = 1 \ \& \ y_{i+\frac{n}{4}} = 0 \ \& \ y_{i+\frac{n}{2}} = 0 \ \& \ \left(y_{i+\frac{n}{2}} = 1 \text{ or } y_{i+n} = 1\right)\right) \& \ y_{i+\frac{n}{2}-1} = 1 \Rightarrow$ Invert $y_{i+\frac{n}{2}-1} = \sim y_{i+\frac{n}{2}-1}$ elseif $\left(y_{i-\frac{3n}{4}} = 0 \ \& \ y_{i+n} = 0 \ \& \ y_{i+n} = 0 \ \& \ \left(\left(y_{i+\frac{n}{4}} = 1 \text{ or } y_{i+\frac{n}{2}} = 1\right) \& \left(y_i = 1 \text{ or } y_{i+\frac{n}{2}} = 1\right)\right)\right) \& \ y_{i+\frac{3n}{4}+1} = 1 \Rightarrow$ Invert $y_{i+\frac{3n}{4}+1} = \sim y_{i+\frac{3n}{4}+1}$ elseif $\left(y_{i+\frac{n}{4}} = 1 \ \& \ y_{i+\frac{n}{2}} = 0 \ \& \ y_{i+n} = 1 \ \& \ \left(y_i = 0 \text{ or } y_{i+\frac{3n}{4}} = 0\right)\right) \& \ y_{i+\frac{n}{2}+1} = 1 \Rightarrow$ Invert $y_{i+\frac{n}{2}+1} = \sim y_{i+\frac{n}{2}+1}$ TABLE 5b-continued b) For I = 1, ..., n + 1    $c'_i = y_i$ elseif $\left(y_i = 0 \ \& \ y_{i+\frac{n}{4}} = 0 \ \& \ y_{i+\frac{n}{2}} = 0 \ \& \ y_{i+\frac{3n}{4}} = 0 \ \& \ y_{i+n} = 1\right)$ or $\left(y_i = 1 \ \& \ y_{i+\frac{n}{4}} = 0 \ \& \ y_{i+\frac{n}{2}} = 0 \ \& \ y_{i+\frac{3n}{4}} = 0 \ \& \ y_{i+n} = 0\right)$ or $\left(y_i = 0 \ \& \ y_{i+\frac{n}{4}} = 0 \ \& \ y_{i+\frac{n}{2}} = 0 \ \& \ y_{i+\frac{3n}{4}} = 1 \ \& \ y_{i+n} = 0\right)$ or $\left(y_i = 0 \ \& \ y_{i+\frac{n}{4}} = 1 \ \& \ y_{i+\frac{n}{2}} = 0 \ \& \ y_{i+\frac{3n}{4}} = 0 \ \& \ y_{i+n} = 0\right) \Rightarrow$ Invert $y_i = \sim y_i$, $y_{i+\frac{n}{4}} = \sim y_{i+\frac{n}{4}}$, $y_{i+\frac{n}{2}} = \sim y_{i+\frac{n}{2}}$, $y_{i+\frac{3n}{4}} = \sim y_{i+\frac{3n}{4}}$, $y_{i+n} = \sim y_{i+n}$ 3. Deconvolution of each estimated pre-encoded codeword $\hat{C}'_{n+1}$ with $\frac{1}{1 \oplus D} \rightarrow$ Restored data $\hat{X}_n$

---

Again, any modulo (n+1) cyclic shifts of the k-constraint controlling samples, produce equivalent codes with respect to the rate n/(n+1) and the constraint k. These highly structured codewords reduce the complexity and encoding/decoding of any codeword length becomes feasible, i.e. the algorithm complexity is fixed irrespective of the codeword length without the need for channel-side information (ternary readback signals). Finally, due to the generated embedded parity, the need for appended parity bits is eliminated, and high-rate codes are easily obtained without requiring very long codewords in order to reach highest efficiency in the limit.

RLL/PED Modulation Codes
A. Construction of the Generalized RLL/PED Class $$\frac{n}{n+1}(\alpha n - 1), n \geq 5,$$

and Special Cases $$\frac{k \times 2^3}{k \times 2^3 + 1}(0, k \times 2^3 - 1), k = 1, 2, 3, \ldots$$

or $$\frac{2^m}{2^m + 1}(0, 2^m - 1), m = 3, 4 \ldots$$

Encoding

1. Convolve all the n+2-tuples 0-padded data words $[0 \ X_n \ 0]$ with $1 \oplus D$ into n+1-tuples codewords $C'_{n+1}$ (see FIGS. 4, 6), or equivalently multiply the data word polynomial $X_n(x)$ with 1+x. All the resulted pre-encoded codewords $C'_{n+1}$ have even weights.

2. Invert the last bit of all the pre-encoded codewords $C'_{n+1}$ ending the 0 to 1, to produce odd-weight codewords $C_{n+1}$. Instead of the last bit any other of the remaining n bit locations (as long as it is the same location for all codewords) can be inverted from 0 to 1. Then all the proposed encoding/decoding steps apply in a similar fashion. However, it is only the last bit choice that generates k=n−1 (as it is explained at the end of subsection A), otherwise in all other cases k=n.

After steps 1. and 2., all the resulted codewords $C_{n+1}$ (even and odd) will be terminated with 1, and the maximum sequence of 0s for any codeword concatenation is equal to n.

Decoding

1. Check the parity of the detected/restored codewords $Y_{n+1}$. If even, then go to step 3.

2. Invert the last bit of all the odd-parity codewords from 1 back to 0 to restore the originally pre-encoded codewords $\hat{C}'_{n+1}$.

3. Deconvolve all the estimated pre-encoded even-weight n+1 bit codewords (step 2) $C'_{n+1}$ with $1/1 \oplus D$ (see FIG. 7), or equivalently perform polynomial division with 1+x to restore the original uncoded user data $\hat{x}_n$.

Error-control

The described RLL demodulation decoder has inherent partial error detection capability. Since a non-zero bit is expected at the end of each restored codeword $Y_{n+1}$, errors are immediately detected by the decoder in the case of the reception of 0-valued end-bits. The error type is indistinguishable whether it is a drop-out, drop-in, bit-shift, or burst etc. The detected bit errors by the demodulator generate erasures which double the correction capability of the subsequent ECC decoder.

---

Simple Encoder

1. Convolution of each 0-padded data word $[0 \ X_n \ 0]$ with $1 \oplus D \rightarrow$ Pre-encoded codeword $C'_{n-1}$
2. Conditional bit inversions $\rightarrow C_{n-1}$ complies with d, k constraints
   If $c'_i = 0 \Rightarrow$ Invert $c_i = \sim c'_i$; $\Rightarrow$ Constraints, Decodability Simple Decoder 1. Parity check of the restored codeword $Y_{n+1}$; If even, then $\hat{C}'_{n+1} = Y_{n+1}$ and go to step 3.
2. Conditional block decoding of odd-weight restored codewords $Y_{n+1}$ only $\rightarrow \hat{C}'_{n+1}$
   a) if $y_i = 1 \Rightarrow$ Invert $y_i = \sim y_i$
      or alternativey, unconditionally: Reset $y_i = 0$;

-continued b) For $i = 1, \ldots, n + 1$ $\hat{c}_i' = y_i$

3. Deconvolution of each estimated preencoded codeword $\hat{C}_{n+1}'$ with $$\frac{1}{1 \oplus D} \rightarrow$$

Restored data $\hat{X}_n$

ErrorControloftherestoredcodeword $Y_{n+1}$: Additionalconstraintstod,k

If $y_i = 0$, then => Bit error(s) detected => Erase current symbol and pass an erasure to the outer concatenated ECC decoder.

---

Other applicable error-control rules are the violations of the d, k constraints by the detected codewords. Note that for PR4 systems only (or indirect 1+D EPR4 architectures), marked errors can also be generated by applying channel-side information such as ternary conditions and polarity alternation violations every other non-zero sample. Following the above methodology here are some of the byte-oriented coding schemes which can be designed: 8/9(0,8), 16/17(0,16), 24/25(0,24), 32/33(0,32) etc. in general $$\frac{n}{n+1}(0, n),$$

or $$\frac{2^m}{2^m+1}(0, 2^m), m = 3, 4, 5, \ldots .$$

Note that the odd-weight codeword 000 . . . 00001 can not be generated by the $1 \oplus D$ operation. Thus via special mapping of the all 0s data word $x_n = \overline{0}$ to an appropriate odd-weighted codeword with at least three 1-valued bits generates the following generalized class of codes with an improved k-constraint (decreased by 1)

$$\frac{n}{n+1}(0, n-1),$$

-continued or $$\frac{2^m}{2^m+1}(0, 2^m - 1), m = 3, 4, 5, \ldots :$$

8/9(0, 7), 16/17(0, 15), 24/25(0, 23), 32/33(0, 31) etc.

B. Construction of the RLL/PED Generalized Class $$\frac{n}{n+1}\left(0, \left[\frac{n}{2}\right]\right), n \geq 5,$$

and Special Cases of Byte-oriented Systems:

$$\frac{k2^3}{k2^3+1}(0, k2^2)\ k = 1, 2, 3, \ldots$$

or $$\frac{2^m}{2^m+1}(0, 2^{m-1}), m = 3, 4, \ldots$$

Based on the example of 16/17(0,8) codeword structuring described above, regarding the 2-bit mapping domain, the following state transition diagram describes the encoder operation:

---

Very Low Complexity Encoder

Stage 1

1. Convolution of each 0-padded data word $[0\ X_n\ 0]$ with $1 \oplus D \rightarrow C_{n+1}'$ pre-encoded codeword
If $C_{n+1}'$ does not satisfy k then:

Stage 2

2. Conditional bit inversions $\rightarrow$ Codewords $C_{n+1}$ comply with d, k constraints if $\left(c_i' = 0\ \&\ c_{i+\left[\frac{n}{2}\right]}' = 0\right) \Rightarrow$ Invert $c_i = \sim c_i',\ c_{i+\left[\frac{n}{2}\right]}' = \sim c_{i+\left[\frac{n}{2}\right]}',\ c_{i+\frac{3n+4}{4}} = \sim c_{i+\frac{3n+4}{4}}';$ elsif $\left(c_i' = 0\ \&\ c_{i+\left[\frac{n}{2}\right]}' = 1\right) \Rightarrow$ Set $c_{i-1} = 1;$ elsif $\left(c_i' = 1\ \&\ c_{i+\left[\frac{n}{2}\right]}' = 0\right) \Rightarrow$ Set $c_{i+\left[\frac{n}{2}\right]+1} = 1;$ Odd – weightcodewords
$\Rightarrow$ Constraint k is satisfied
Decodability is secured Very Low Complexity Decoder 1. Parity check of the restored codeword $Y_{n+1}(x)$, or $Y_{n+1}$; If even, then $\hat{C}_{n+1}'(x) = Y_{n+1}(x)$ and go to step 3.
2. Conditional block decoding of odd-weight restored codewords $Y_{n+1}(x)$ only $\rightarrow \hat{C}_{n+1}'(x)$ a) If $\left(y_i = 1\ \&\ y_{i+\left[\frac{n}{2}\right]} = 1\right) \Rightarrow$ Invert $y_i = \sim y_i,\ y_{i+\left[\frac{n}{2}\right]} = \sim y_{i+\left[\frac{n}{2}\right]},\ y_{i+\left[\frac{3n+4}{4}\right]} = \sim y_{i+\left[\frac{3n+4}{4}\right]};$ elseif $\left(y_i = 0\ \&\ y_{i+\left[\frac{n}{2}\right]} = 1\right)\ \&\ y_{i-1} = 1 \Rightarrow$ Invert $y_{i-1} = \sim y_{i-1};$ elseif $\left(y_i = 1\ \&\ y_{i+\left[\frac{n}{2}\right]} = 0\right)\ \&\ y_{i+\left[\frac{n}{2}\right]+1} = 1 \Rightarrow$ Invert $y_{i+\left[\frac{n}{2}\right]+1} = \sim y_{i+\left[\frac{n}{2}\right]+1};$ b) For $i = 1, \ldots, n + 1\ c_i' = y_i.$ 3. Division of each estimated pre-encoded codeword $\dfrac{\hat{C}'_{n+1}(x)}{1+x} \to$ Restored data $\hat{X}_n(x)$ or equivalently deconvolve $\hat{C}'_{n+1} * \dfrac{1}{1 \oplus D} \Rightarrow$ Restored data $\hat{X}_n$ The error-control equations emanate from observing the signal space partitioning (see FIG. 1) by the encoder's mapping rules and complementing its functions. During encoding, the bit $c_{i-1}$ is set to 1 under the condition that $c'_i=0$ & $c'_{i+[n/2]}=1$ and consequently that bit will be always equal to 1 independent of the codeword's parity given that the above condition is satisfied. Consequently, an error is detected if the restored codeword satisfies the necessary condition $y_i=0$ & $y_{i+[n/2]}=1$ while $y_{i-1}=0$. Similarly the error detection rule operates for $y_{i+[n/2]+1}$ with enabling condition $y_i=1$ & $y_{i+[n/2]}=0$. Finally, the stronger error detection check is formed by the invalid 2-bit combination $y_i32\ 0$ & $y_{i+[n/2]}=0$.

The constraint k was decreased by increasing the number of partition-controlling samples $c'_i$ from 1 to 2 (1-bit→2-bit partitioning). Encoding/decoding remains simple irrespective of the codeword length or the code rate.

Another expression for the 2-bit codes where the length of the data word is an integer multiple of an 8-bit byte, i.e. $n=t2^3$, where $t \in Z^+$:

Error Control of the restored codeword $Y_{n+1}$: Additional constraints to $d, k$ $$\left.\begin{array}{ll} \text{if} & y_i = 0 \ \&\ y_{i+\left[\frac{n}{2}\right]} = 0 \\ \text{elseif} & y_i = 0 \ \&\ y_{i+\left[\frac{n}{2}\right]} = 1 \ \&\ y_{i-1} = 0 \\ \text{elseif} & y_i = 1 \ \&\ y_{i+\left[\frac{n}{2}\right]} = 0 \ \&\ y_{i+\left[\frac{n}{2}\right]+1} = 0 \end{array}\right\} \Rightarrow \text{Bit error(s) detected} \Rightarrow \text{Erase current symbol and}$$

pass an erasure to the outer concatenated ECC decoder;

The combinations forming the constraints are mutually-exclusive conditions separated with "else-ifs". The fact that the encoder, decoder, k-constraint and error-control equations have been expressed as functions of the data word length n, eliminates an additional design effort if a higher rate code n/(n+1) of larger codeword length n+1 were desired. An implementation of a code-rate programmable read channel is also possible.

$$\dfrac{t2^3}{t2^3+1}(0, t2^2).$$

In Table 4, the programmable controlling samples of the adjustable code rates are listed, i.e. a range of code rates spanning from 8/9 up to 40/41 or higher. The length of the data word n, is the only parameter that needs to be known:

TABLE 6

The samples controlling the constraint k;

| 1-Bit | 2-Bit | 5-Bit |
|---|---|---|
| $\dfrac{n}{n+1}(0, d = n-1/I = n)$ | $\dfrac{n}{n+1}\left(0, d = \left[\dfrac{n}{2}\right]/I = n+4\right)$ | $\dfrac{n}{n+1}\left(0, d = \left[\dfrac{n}{2}\right]/I = n\right)$ |
| 1-sample $c_i$ | 5-samples | 5-samples |
| | $c_{i-1}\ c_i\ c_{i+\left[\frac{n}{2}\right]}\ c_{i+\left[\frac{n}{2}\right]+1}\ c_{i+\frac{3n+4}{4}}$ | $c_i\ c_{i+\frac{n}{4}}\ c_{i+\frac{n}{2}}\ c_{i-\frac{3n}{4}}\ c_{i+n}$ |
| $i = 1, \ldots, n+1$ n + 1 equivalent codes | By shifting cyclically the 5 samples above, for $i = 1, \ldots, n + 1$, then n + 1 equivalent codes are produced | By shifting cyclically the 5 samples above, for $i = 1, \ldots, n + 1$, then n + 1 equivalent codes are produced |

Equivalent codes are with respect to rate, and k, 1 constraints.

TABLE 7

RLL/PED codes for byte-oriented systems
1): $n = t \times 2^3$, where $t \in Z^+$, 2) $n = 2^m$, $m = 3, 4, 5, 6, \ldots$

| Programmable Parameter | |
|---|---|
| $t = 1, 2, 3, 4, 5, 6 \ldots$ | $m = 3, 4, 5, 6 \ldots$ |
| Achieved code rates | |
| $\underbrace{\dfrac{t \times 2^3}{t \times 2^3 + 1}}_{\text{Rate}} (0, \underbrace{t \times 2^2}_{k})$ | $\underbrace{\dfrac{2^m}{2^m + 1}}_{\text{Rate}} (0, \underbrace{2^{m-1}}_{k})$ |
| 8/9(0,4), 16/17(0,8), 24/25(0,12) 32/33(0,16), 40/41(0,20), . . . | 8/9(0,4), 16/17(0,8), 32/33(0,16), 64/65(0,32), . . . |
| k-constraint controlling samples | |
| for $i = 1, \ldots, t \times 2^3 + 1$ (where all samples shift cyclically modulo $(t \times 2^3 + 1)$) | for $i = 1, \ldots, 2^m + 1$ (where all samples shift cyclically modulo $(2^m + 1)$) |
| $\underbrace{y_{i-1}, y_i, y_{i+t\times 2^2}, y_{i+1+t\times 2^2}, y_{i+1+3\times t\times 2}}_{\text{Parity Control}}$ | $\underbrace{y_{i-1}, y_i, y_{i+2^{m-1}}, y_{i+1+2^{m-1}}, y_{i+1+3\times 2^{m-2}}}_{\text{Parity Control}}$ |

With reference to FIGS. 9–12 there is illustrated another embodiment of the present invention. These figures present a possible hardware implementation of a 24/25(0,12) code having a 2-bit partition with n=24 and i=3 according to the 2-bit general family of codes described above. In a similar fashion, all the codes belonging to the family of codes or coding schemes described in the above tables and formulae could be implemented in hardware by those skilled in the electronic arts. Thus it is recognized that the following described embodiment is only representative of the scope of Applicant's invention.

Figure 9:
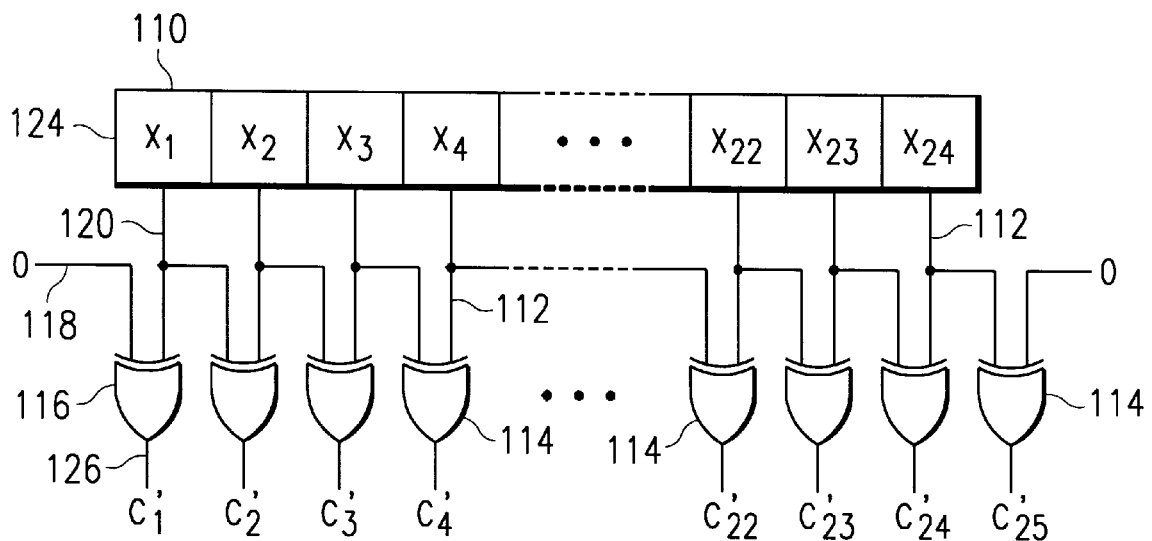
FIG. 9 Shows a schematic diagram of the first stage of an encoder according to an embodiment having the form 24/25 (d=0, k=12)

FIG. 9 illustrates a schematic for the first encoder stage of the representative modulation scheme, shown above as part 1 of the encoding process in Table 2. As shown, the 24 bit data word having bits $x_1$ through $x_{24}$ is held in a 24 bit register 110. Each bit of the register has an output 112 connected to two exclusive-or gates 114. The $1 \oplus D$ function is accomplished by operating on adjacent bits of the data bits with the logical exclusive-or function. One each end of the register, one exclusive-or gate also has an input of a logical one to provide the padding of zero bits discussed above. In particular, exclusive-or gate 116 has input 118 from logical zero and input 120 from bit $x_1$ 124. Output of exclusive-or gate 116 is $c'_1$ 126. In the same manner, each of the adjacent bits of register 110 is exclusive-or'd to produce the pre-encoded data word $C'_{n+1}$ as described above and illustrated in FIG. 9.

Figure 10:
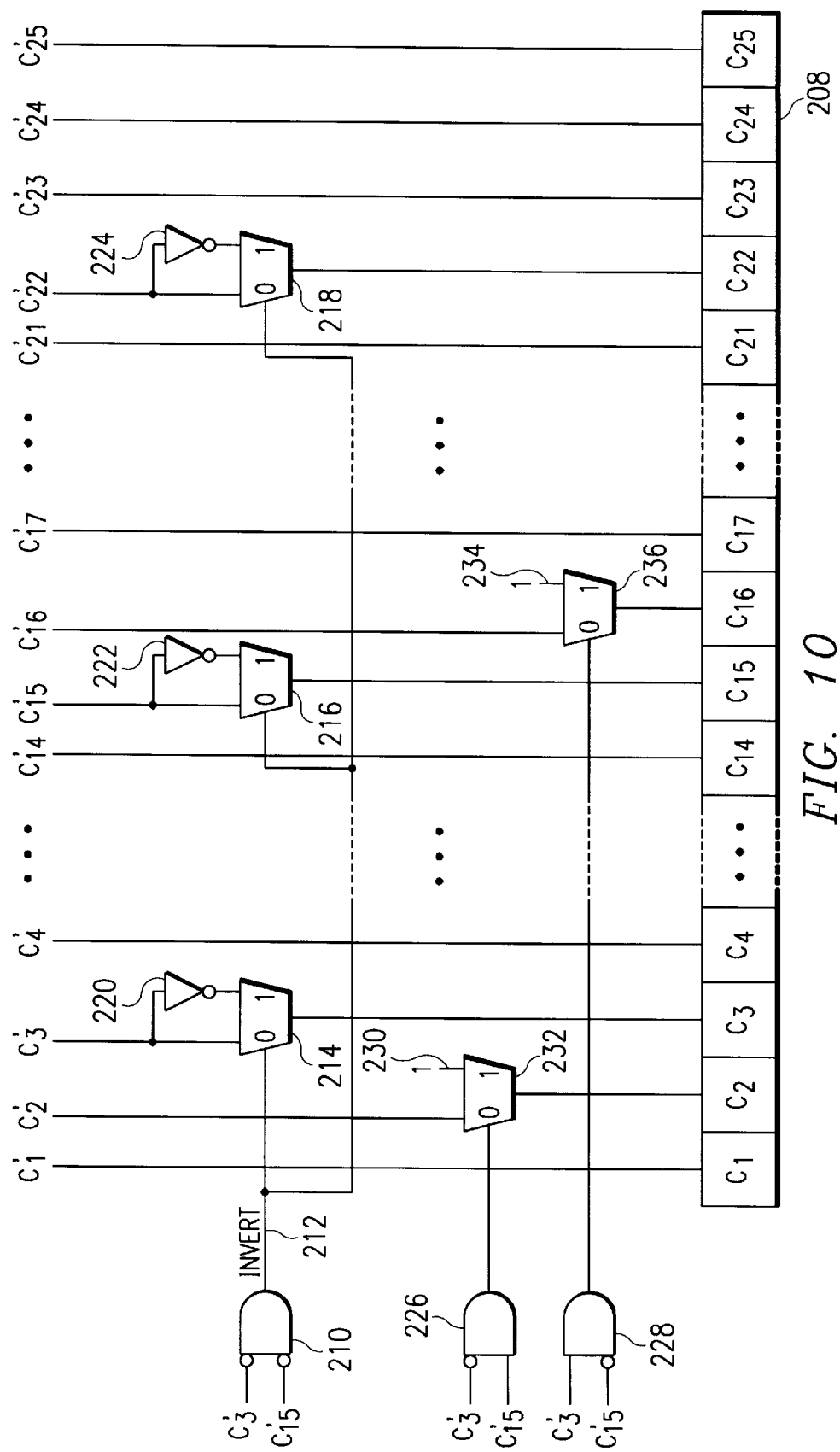
FIG. 10 Shows a schematic diagram of the second stage of an encoder according to an embodiment having the form 24/25(d=0, k=12)

FIG. 10 illustrates a schematic for the second encoder stage of the representative modulation scheme. The second encoder stage is shown above as part 2 of the encoding process in Table 2, with reference to the conditional bit mapping of Table 3. Inputs to the second stage are the pre-encoded bits $c'_{25}$ which were created by the circuit of FIG. 9. The output of this circuit is the encoded bits $C_{25}$. Five of the c' code bits are manipulated by the circuit of FIG. 10 as described below, while the remaining bits flow directly to encoded bits C. In this embodiment, the code bits $c_1$ through $c_{25}$ are shown as contents of a 25-bit register 208.

In the illustrated embodiment, for the conditional bit inversions, l was chosen to be 3. Thus, if $c'_3$ and $c'_{15}$ are both low, the bits $c'_3$, $c'_{15}$, and $c'_{23}$ are inverted as directed by the conditional block mapping to achieve the target k-constraint. This function is accomplished through Nor gate 210 which has inputs $c'_3$ and $c'_{15}$ with output 212 connected to the control inputs of multiplexors 214, 216, and 218. These multiplexors have inputs from bits $c'_3$, $c'_{15}$, and $c'_{23}$ and the inverted $c'_3$, $c'_{15}$, and $c'_{23}$ signals provided by inverters 220, 222, and 224. The remaining conditional bit inversions are provided by gates 226 and 228. Gate 226 selects the high input 230 of multiplexor 232 to set the bit high when $c'_3$ is low and $c'_{15}$ is high. Similarly, gate 228 selects the high input 234 of multiplexor 236 to set the bit high when $c'_3$ is high and $c'_{15}$ is low.

Figure 11:
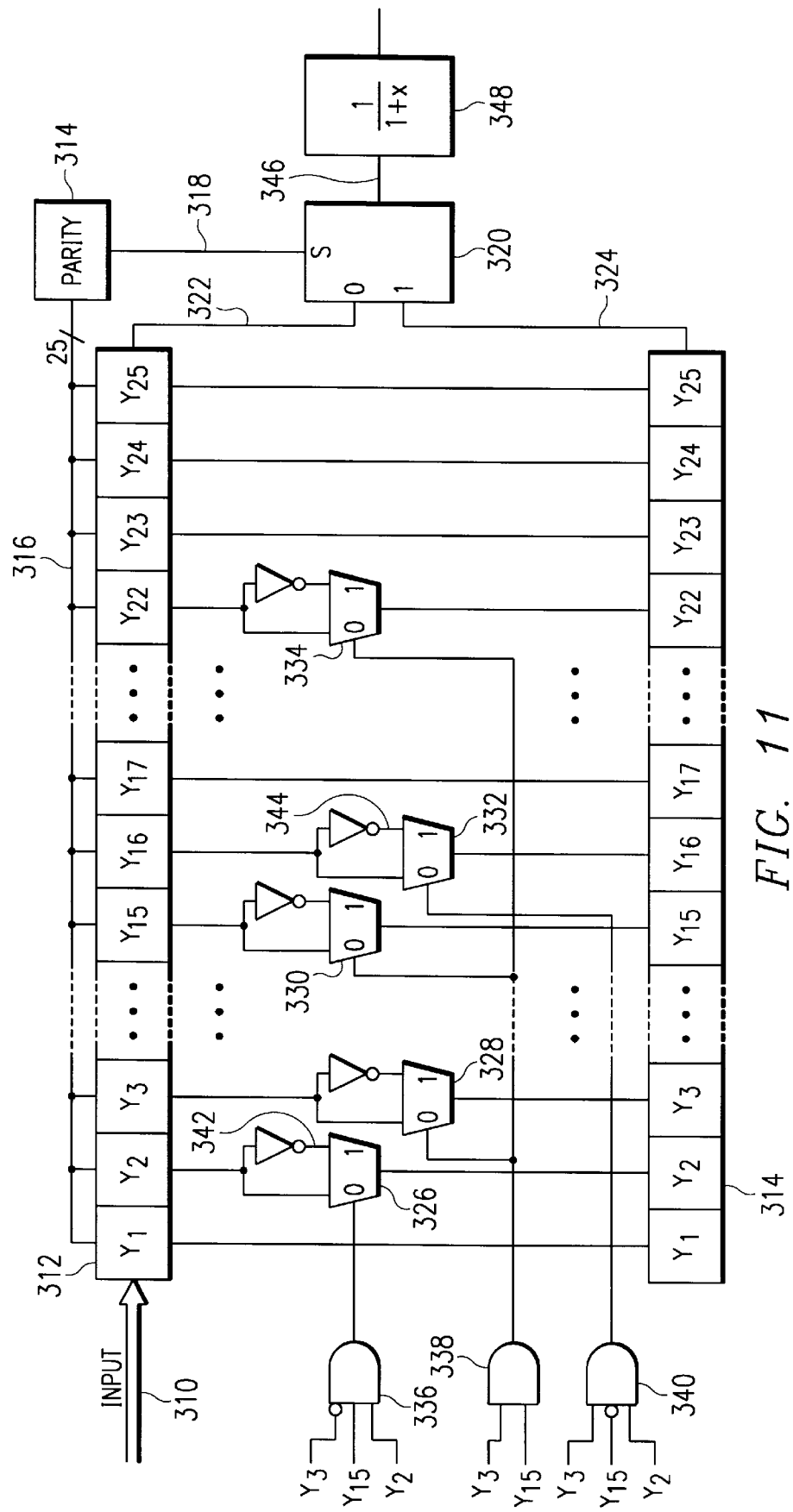
FIG. 11 Shows a schematic diagram of the decoder according to an embodiment having the form 24/25(d=0, k=12)

FIG. 11 illustrates a schematic for the decoder stage of the representative modulation scheme. Input code bits $y_1$ through $y_{25}$ are output from the detector 440 of (FIG. 14) the digital data channel, such as from a hard disk drive, on input 310 to a 25 bit shift register 312. A second shift register 314 will be used to hold the restored even weighted codes words that were transmitted as odd codewords after the bit conversions by the encoder. A parity block 314 inputs the logic state of each of the input code bits $y_1$ through $y_{25}$ on input bus 316. The output 318 of parity block 314 is connected to multiplexor 320 to select input for the multiplexor from input 322 or 324. Input 322 is connected to a shift output of shift register 312. Likewise, input 324 is connected to a shift output of shift register 314.

Shift register 314 holds restored odd bit codes words. Multiplexors 326, 328, 330, 332 and 334 are located logically between shift register 312 and shift register 314 and used to control bit inversions of input code bits $y_2$, $y_3$, $y_{15}$, $y_{16}$, and $y_{22}$. The remaining bits of shift register 312 are connected directly to shift register 314 as represented by $y_1$, $y_{17}$, $y_{23}$, $y_{24}$ and $y_{25}$. Gates 336, 338, and 340 have inputs $y_3$, $y_{15}$, and $y_2$ (these inputs are logically the same as values in the respective bits of shift register 312) to selectively activate multiplexors 326, 328, 330, 332 and 334. Gate 336 inverts bit $y_2$ for the condition ($y_3=0$ and $y_{15}=1$ and $y_2=1$) by selecting the inverted input 342 of multiplexor 326. Gate 338 inverts bits $y_3$, $y_{16}$ and $y_{22}$ for the condition ($y_3=1$ and $y_{15}=1$) by selecting the inverted input of multiplexors 328, 330 and 334. Gate 338 inverts bit $y_{16}$ for the condition ($y_3=1$ and $y_{15}=0$ and $y_2=1$) by selecting the inverted input 344 of multiplexor 332.

The circuit of FIG. 11 operates to decode the input code bits $y_1$ through $y_{25}$. Depending on the parity of the contents of shift register 312 either the even weighted code word in shift register 312 is passed through multiplexor 320 or the restored even weighted word in shift register 314. The output 346 of multiplexor 320 is connected to division or deconvolution block 348. Deconvolution block 348 performs a $1/(1+x)$ in the polynomial domain to complete the decoding and restore the code word to its original state. The details of deconvolution block 348 and parity block 314 well known and not included here. Additional details such as the latching of the parity to maintain select signal 318 are also not shown, but are well understood by those skilled in the art.

Figure 12:
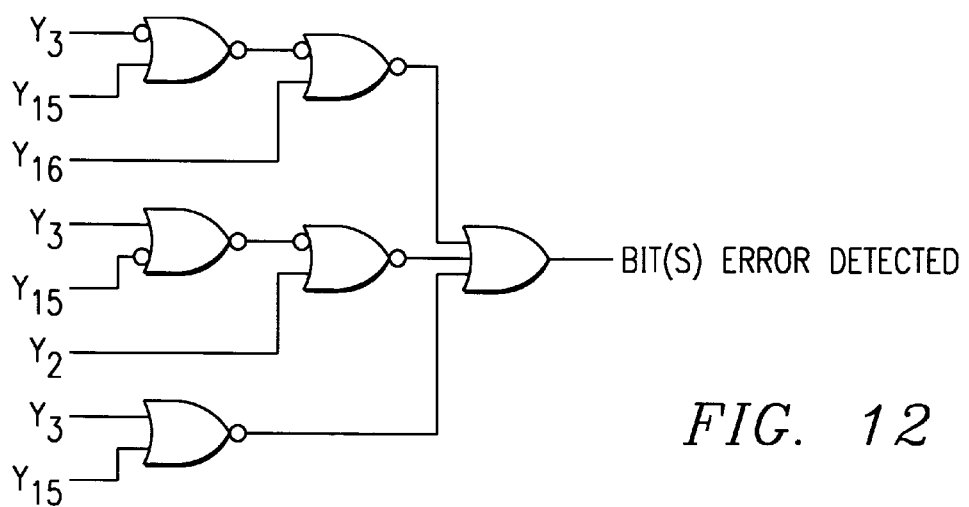
FIG. 12 Shows a schematic diagram of the error detection circuit (PED) according to an embodiment having the form 24/25(d=0, k=12)

FIG. 12 illustrates a circuit diagram of a circuit for detecting bits in error 400. When an error is detected, a message to erase the current symbol may be passed to the ECC circuit. The circuit shown detects if one of the three error states ($y_3=0$ and $y_{15}=1$ and $y_{16}=1$) or ($y_3=1$ and $y_{15}=0$ and $y_2=1$) or ($y_3=1$ and $y_{15}=1$), for the illustrated embodiment of FIGS. 9–12, are detected.

Figure 13:
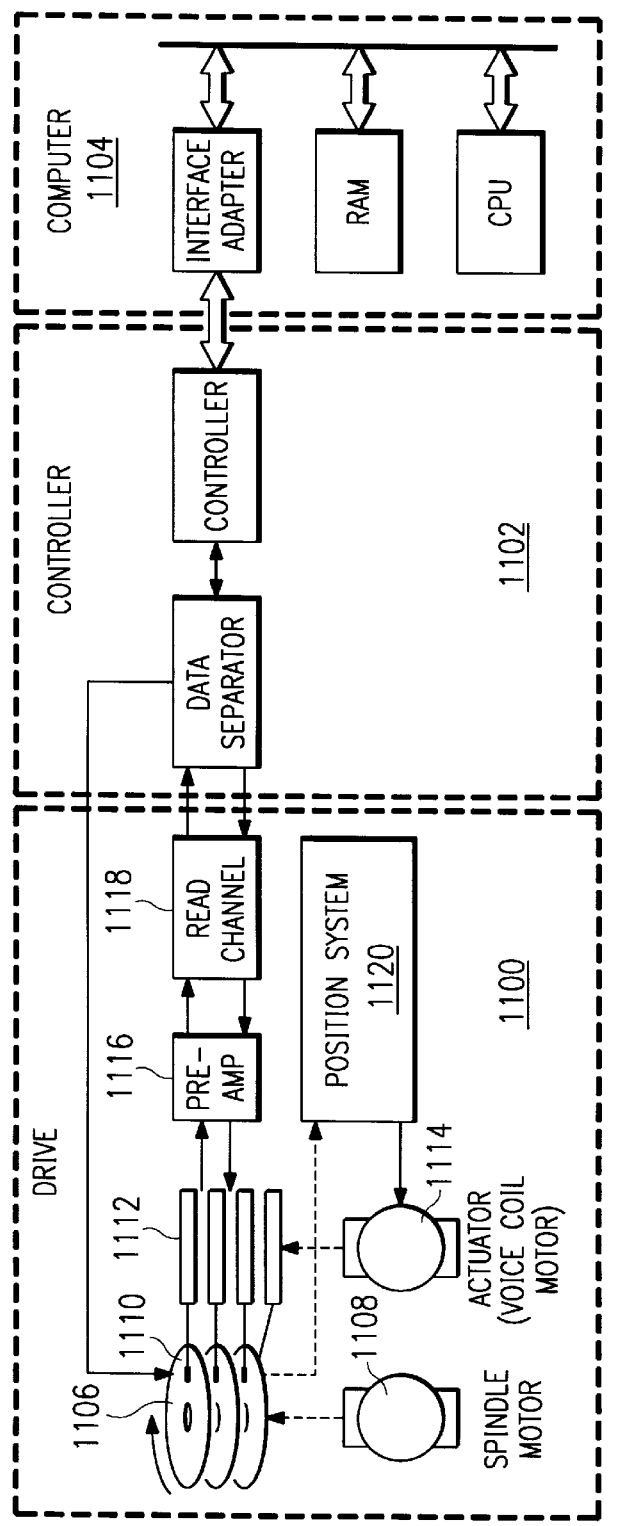
FIG. 13 Shows a block diagram of a hard disk drive according to an embodiment.

FIG. 13 represents a system level view of a HDD according to the present invention. The hard disk drive 1100 is connected to a computer 1102 through a controller 1104. The hard disk drive 1100 has disk platters 1106 which are driven by motor 1108 to rotate as shown. Read and write heads 110 move upon an actuator mechanism 1112 driven by a voice coil motor 1114. Data detected by the heads is passed through the preamp 1116 and then a read channel 1118 and also used to provide feedback to the head actuator position system 1120. Data signals from the HDD are fed to the controller 1102 which is then passed to the computer 1104. The present invention concerns improvements to the drive circuitry to write heads 1110 as discussed above.

Figure 14:
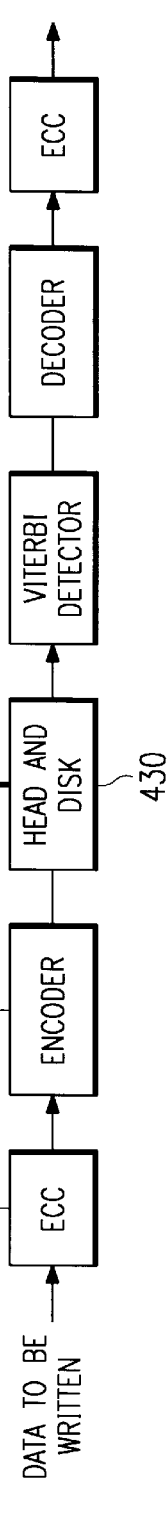
FIG. 14 Shows a block diagram of a read channel having an encoder and decoder according to an embodiment of the present invention.

FIG. 14 shows a block diagram of a PRML read channel 400 in a HDD system which incorporates the encoding system described above. Data to be written to the disk is input to error correction coding block (ECC) 420. After EEC block 420, the data is then processed by Encoder 410. Encoder 410 may incorporate one of the family of encoding schemes described above. The encoder output may be processed by a precoder (not shown) and then passed as an input to a PRML channel 430 which writes data to the disk 1106 in a conventional manner. The channel output is detected by Viterbi detector block 440. After detection, the input codes bits are decoded as described above with the inverse of the coding scheme used by encoder 410. After decoding, the data is processed by a the ECC block 422 which is an inverse of the function of ECC block 420.

4/5 MTR (j=2, k=8) with Partial Error Detection: MTR/PED

In the RLL case the k, l constraints are positive monotonic functions of the data word length n, and therefore they increase as the codeword's length n+1 increases. Consequently by relaxing the coding constraints the capacity increases and the RLL code rate increases. On the other hand, unless look-ahead techniques are used, it is impossible to design block MTR codes with j=2 constraint of rate higher than 4/5. In an attempt to proceed with higher rates, the number of available codewords A is insufficient for a unique mapping and decoding fails, e.g. for a 5/6 code rate there are 31 available codewords (or 30 if we exclude the all 0s codeword) instead of the needed number of 32.

In this section minor modifications of the new coding techniques are applied to generate very low complexity MTR codes.

TABLE 8

The 4|5 (j = 2, k = 8) MTR code:

| Data word $\xrightarrow{1 \oplus D}$ | $C'_{n+1}$ | if $(c'_2=1\ \&\ c'_1=1) \Rightarrow c_2 = \sim c_2$ | elseif $(c'_4=1\ \&\ c'_5=1) \Rightarrow c_4 = \sim c_4$ |
|---|---|---|---|
| 1 | 0000 | 00000 | 00000 | 00000 |
| 2 | 0001 | 00011 | 00011 | 00001 |
| 3 | 0010 | 00110 | 00110 | 00110 |
| 4 | 0011 | 00101 | 00101 | 00101 |
| 5 | 0100 | 01100 | 01100 | 01100 |
| 6 | 0101 | 01111 | 01111 | 01101 |
| 7 | 0110 | 01010 | 01010 | 01010 |
| 8 | 0111 | 01001 | 01001 | 01001 |
| 9 | 1000 | 11000 | 10000 | 10000 |
| 10 | 1001 | 11011 | 10011 | 10011 |
| 11 | 1010 | 11110 | 10110 | 10110 |
| 12 | 1011 | 11101 | 10101 | 10101 |
| 13 | 1100 | 10100 | 10100 | 10100 |
| 14 | 1101 | 10111 | 10111 | 10101 |
| 15 | 1110 | 10010 | 10010 | 10010 |
| 16 | 1111 | 10001 | 10001 | 10001 |

After the pre-encoding stage of convoluting 0-padded data words [0 $X_n$ 0] with $1 \oplus D$, the pre-encoded codewords $C'_{n+1}=2, 6, 9, 10, 11, 12, 14$ are violating the j=2 constraint, while codeword 1 is violating the k=8 constraint. Therefore 8 out of 16 pre-encoded codewords $C'_{n+1}$ need to be transformed into odd-weighted codewords (see Table 8). Special mapping is needed for the following 3 words:

| 1 | 0000 → 00100 | Otherwise k = 8 is violated |
| 10 | 1001 → 00010 | Otherwise j = 2 is violated (see Table 6) |
| 14 | 1101 → 01000 | Otherwise 14 & 12 are mapped onto the same codeword) (see Table 6) |

Very Low Complexity MTR Encoder

1. Convolution of 0 - padded data words [0 $X_n$ 0] with $1 \oplus D$ → Pre-encoded codewords $C'_{n+1}$
2. Special codewords $C_{n+1}$
3. Conditional block - mapping $C'_{n+1}$ → Codewords $C_{n+1}$
   if $(c'_2 = 1\ \&\ c'_1 = 1)$ → Invert $c_2 = \sim c_2$;
   elseif $(c'_4 = 1\ \&\ c'_5 = 1)$ → Invert $c_4 = \sim c_4$;

Very Low Complexity MTR Decoder

-continued

1. Special codewords
2. Parity check of the restored codeword $Y_{n+1}$; If even, then $\hat{C}'_{n+1} = Y_{n+1}$ and go to step 4.
3. Conditional block - decoding of the odd - weighted restored codewords $Y_{n+1} \rightarrow \hat{C}'_{n+1}$
   a) If $\quad(y_2 = 0 \ \& \ y_1 = 1) \rightarrow$ Invert $y_2 = \sim y_2$;
      elseif $(y_4 = 0 \ \& \ y_5 = 1) \rightarrow$ Invert $y_4 = \sim y_4$;
   b) For $i = 1, \ldots, n + 1 \quad \hat{c}'_i = y_i$ 4. Deconvolution of estimated preencoded codewords $\hat{C}'_{n+1}$ with $\dfrac{1}{1 \oplus D} \rightarrow$ Restored data $\hat{X}_n$ Error Control of the Restored Codeword $Y_{n+1}$: Identical to j=2 Constraint In general for any MTR scheme with j=2 constraint of the code, an erasure can be generated if there are more than two transitions in the row inside the codeword's boundaries, or 2 or more transitions at the codeword's boundaries.

For the 4/5MTR case using the new proposed code-construction methodology, there was no need for look-ahead encoder/decoder. Therefore there is no related unlimited error-propagation problem. Note that due to the polynomial division operation at the decoder's end, the system is prone to a limited error propagation within a window length equal to one codeword. Furthermore, if a direct block mapping to a properly chosen set of codewords was performed instead of initially using the $1 \oplus D$ pre-encoding domain, it would result to a higher complexity MTR encoder/decoder.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for modulating a predefined number of bits of a binary data word $X_n$ with a predetermined set of target constraints into codewords having a predefined number of code bits $C_{n+1}$ bits comprising the steps of:
   a. pad the data word $[X_n = x_1 \ x_2 \ldots x_n]$ with zeros to the form $[0 \ x_1 \ x_2 \ldots x_n \ 0]$,
   b. process the padded data word with $1 \oplus D$ to form the pre-encoded codeword $C'_{n+1}$ such that all $C'_{n+1}$ have even weight; and
   c. choose the pre-encoded codewords $C'_{n+1}$ which violate a target constraint and invert in a decodable way an odd number of bits of the codeword to form the odd parity codeword $C_{n+1}$ which satisfies the target constraints.

2. The modulation method according to claim 1, further comprising the decoding steps of:
   d. Receiving a codeword $Y_{n+1}$;
   e. Checking the parity of codeword $Y_{n+1}$ to determine odd parity and even parity words of the received codewords, for codewords $Y_{n+1}$ found to have even parity skip to step g, otherwise proceeding to step f;
   f. inverting back to the initial even weight state by reversing the chosen odd number of bits of received odd weight codewords $Y_{n+1}$; and
   g. Process the evenweight codewords resulting from step f and the received even weight parity codewords $Y_{n+1}$ from step e with $1/(1 \oplus D)$ to restore the n bit data word $X_n$.

3. The modulation method according to claim 2, further comprising:
   h. detecting illegal codewords which were mapped out of the valid set of code words by the inverting of bits in step b and passing an error condition signal to an error correction system.

4. The modulation method according to claim 2, wherein step c further comprises the codeword $C_{n+1}$ being stored on a computer hard disk drive and wherein step d further comprises receiving the codeword $Y_{n+1}$ from said computer hard disk drive.

5. A method for RLL coding a predefined number of bits of a binary data word $X_n$ with predetermined target constraints into codewords having a predefined number of code bits $C_{n+1}$ comprising the steps of:
   a. pad the data word $X_n = [x_1 \ x_2 \ldots x_n]$ with zeros to the form $[0 \ x_1 \ x_2 \ldots x_n \ 0]$,
   b. process the padded data word with $1 \oplus D$ to form the pre-encoded codeword $C'_{n+1}$; and
   c. choose the pre-encoded codewords which violate a target constraint and invert an odd number of bits of the codeword to form the codeword $C_{n+1}$ so that said target constraints are satisfied.

6. The modulation method according to claim 5, further comprising the decoding steps of:
   d. Receiving a codeword $Y_{n+1}$;
   e. Checking the parity of codeword $Y_{n+1}$ to find odd parity and even parity words of the received codewords $Y_{n+1}$, for codewords $Y_{n+1}$ found to have even parity skip to step g, otherwise proceeding to step f;
   f. inverting back to the initial even weight state by reversing the chosen odd number of bits of received odd weight codewords $Y_{n+1}$; and
   g. Process the evenweight codewords resulting from step f and the received even weight parity codewords $Y_{n+1}$ from step e with $1/(1 \oplus D)$ to restore the n bit data word $X_n$.

7. The modulation method according to claim 6, further comprising:
   h. detecting illegal codewords which were mapped out of the valid set of code words by the inverting of bits in step b and passing an error condition signal to an error correction system.

8. The modulation method according to claim 6, wherein step c further comprises the codeword $C_{n+1}$ being stored on a computer hard disk drive and wherein step d further comprises receiving the codeword $Y_{n+1}$ from said computer hard disk drive.

9. The modulation method according to claim 6, wherein the code rate and constraints is of the type 24/25(d=0, k=12) with a 2-bit partition of the pre-encoded codeword.

10. The modulation method according to claim 6, wherein the code rate and constraints is of the type 16/17(d=0, k=8) with a 2-bit partition of the pre-encoded codeword.

11. The modulation method according to claim 6, wherein the code rate and constraints is of the type 8/9(d=0, k=4) with a 2-bit partition of the pre-encoded codeword.

12. The modulation method according to claim 6, wherein the code rate and constraints is of the type 32/33(d=0, k=16) with a 2-bit partition of the pre-encoded codeword.

13. The modulation method according to claim 6, wherein the code rate and constraints is of the type 24/25(d=0, k=12) with a 5-bit partition of the pre-encoded codeword.

14. The modulation method according to claim 6, wherein the code rate and constraints is of the type 16/17(d=0, k=8) with a 5-bit partition of the pre-encoded codeword.

15. The modulation method according to claim 6, wherein the code rate and constraints is of the type 32/33(d=0, k=16) with a 5-bit partition of the pre-encoded codeword.

16. The modulation method according to claim 6, wherein the code rate and constraints is of the type 8/9(d=0, k=7) with a 1-bit partition of the pre-encoded codeword.

17. A computer hard disk drive having a digital communications system which modulates a predefined number of bits of a binary data word $X_n$ with a predetermined set of target constraints into codewords having a predefined number of code bits $C_{n+1}$ bits comprising:
   a. a convolution circuit for processing the padded data word of the form [0 $X_n$ 0], with $1 \oplus D$ to form the pre-encoded codeword $C'_{n+1}$; and
   b. a inversion circuit which inverts an odd number of bits of the any codewords which violate a target constraint to form the codeword $C_{n+1}$.

18. The computer hard disk drive according to claim 17, further comprising:
   c. a parity circuit for checking the parity of the received codeword $Y_{n+1}$ to find odd parity and even parity words of the received codewords $Y_{n+1}$;
   d. a inverting circuit for inverting back to the initial state by reversing the chosen odd number of bits of all odd parity words; and
   e. a deconvolution circuit for processing the inverted odd parity codewords and the even parity codewords with $1/(1 \oplus D)$ to restore the n bit data word $X_n$.

19. The computer hard disk drive according to claim 18, wherein the code rate and constraints is of the type 24/25 (d=0, k=12), a 2-bit partition of the pre-encoded codeword is formed and the maximum number of bits flipped in a single codeword is three.

20. The computer hard disk drive according to claim 18, wherein the code rate and constraints is of the type 16/17 (d=0, k=8), a 2-bit partition of the pre-encoded codeword is formed and the maximum number of bits flipped simultaneously in a single codeword is three.

21. The computer hard disk drive according to claim 18, wherein the code rate and constraints is of the type 32/33 (d=0, k=16), where a 2-bit partition of the pre-encoded codeword is formed and the maximum number of bits flipped simultaneously in a single codeword is three.

22. The computer hard disk drive according to claim 18, wherein the code rate and constraints is of the type 24/25 (d=0, k=12)), where a 5-bit partition of the pre-encoded codeword is formed and the maximum number of bits flipped simultaneously in a single codeword is five.

23. The computer hard disk drive according to claim 18 wherein the code rate and constraints is of the type 16/17 (d=0, k=8), where a 5-bit partition of the pre-encoded codeword is formed and the maximum number of bits flipped simultaneously in a single codeword is five.

24. The computer hard disk drive according to claim 18 wherein the code rate and constraints is of the type 32/33 (d=0, k=16), where a 5-bit partition of the pre-encoded codeword is formed and the maximum number of bits flipped simultaneously in a single codeword is five.

* * * * *